United States Patent
Berkovich et al.

(10) Patent No.: US 12,034,015 B2
(45) Date of Patent: Jul. 9, 2024

(54) PROGRAMMABLE PIXEL ARRAY

(71) Applicant: Facebook Technologies, LLC, Menlo Park, CA (US)

(72) Inventors: Andrew Samuel Berkovich, Bellevue, WA (US); Xinqiao Liu, Medina, WA (US); Richard Andrew Newcombe, Seattle, WA (US); Song Chen, Redmond, WA (US); Wei Gao, Bothell, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 208 days.

(21) Appl. No.: 16/421,441

(22) Filed: May 23, 2019

(65) Prior Publication Data
US 2019/0363118 A1 Nov. 28, 2019

Related U.S. Application Data

(60) Provisional application No. 62/676,849, filed on May 25, 2018.

(51) Int. Cl.
*H04N 23/80* (2023.01)
*H01L 27/146* (2006.01)
(Continued)

(52) U.S. Cl.
CPC ... *H01L 27/14605* (2013.01); *H04N 5/23229* (2013.01); *H04N 5/341* (2013.01)

(58) Field of Classification Search
CPC .............. H04N 5/23229; H04N 5/341; H04N 5/23218; H04N 5/23227; H04N 5/345;
(Continued)

(56) References Cited

U.S. PATENT DOCUMENTS

| 4,121,896 A | 10/1978 | Shepherd |
| 6,384,905 B1 | 5/2002 | Barrows |

(Continued)

FOREIGN PATENT DOCUMENTS

| CN | 102665049 A | 9/2012 |
| CN | 103207716 A | 7/2013 |

(Continued)

OTHER PUBLICATIONS

U.S. Appl. No. 16/715,792, "Notice of Allowance", dated Apr. 16, 2021, 10 pages.

(Continued)

*Primary Examiner* — Marly S Camargo
(74) *Attorney, Agent, or Firm* — Kilpatrick Townsend & Stockton LLP

(57) ABSTRACT

Methods and systems for performing light measurement are disclosed. In one example, an apparatus comprises an array of pixel cells, each pixel cell of the array of pixel cells configured to perform a light measurement operation and to generate a digital output of the light measurement operation. The apparatus further includes a peripheral circuit configured to: receive a pixel array programming map including programming data targeted at each pixel cell of the array of pixel cells, and configure the light measurement operation at the each pixel cell based on the programming data targeted at the each pixel cell. The apparatus further includes an image processor configured to generate an image frame based on the digital outputs of at least some of the array of pixel cells.

20 Claims, 28 Drawing Sheets

(51) Int. Cl.
  *H04N 5/232* (2006.01)
  *H04N 5/341* (2011.01)
  *H04N 23/61* (2023.01)
  *H04N 23/66* (2023.01)
  *H04N 25/40* (2023.01)
  *H04N 25/44* (2023.01)
  *H04N 25/53* (2023.01)
  *H04N 25/77* (2023.01)
  *H04N 25/79* (2023.01)

(58) Field of Classification Search
  CPC .. H04N 5/347; H04N 5/3535; H04N 5/37445; H04N 5/3746; H04N 5/37452; H04N 5/37454; H04N 5/35563; H04N 5/36555; H04N 7/0127; H01L 27/14605; G06T 3/606
  USPC .......... 348/207.99, 300, 301, 302, 308, 294, 348/296, 297; 257/291, 292, 258, 390, 257/443, 730; 250/208.1, 208.2
  See application file for complete search history.

(56) References Cited

U.S. PATENT DOCUMENTS

| | | | |
|---|---|---|---|
| 6,853,579 B1 | 2/2005 | Chou | |
| 7,359,275 B1 | 4/2008 | Wu | |
| 7,362,355 B1 | 4/2008 | Yang et al. | |
| 7,659,925 B2 | 2/2010 | Krymski | |
| 7,920,409 B1 | 4/2011 | Clark et al. | |
| 7,956,914 B2 | 6/2011 | Xu | |
| 7,969,759 B1 | 6/2011 | Thummalapally et al. | |
| 8,134,623 B2 | 3/2012 | Purcell et al. | |
| 8,441,535 B2 | 5/2013 | Morin | |
| 8,675,110 B2 | 3/2014 | Hirai et al. | |
| 8,779,346 B2 | 7/2014 | Fowler et al. | |
| 9,094,629 B2 | 7/2015 | Ishibashi | |
| 9,210,330 B2 | 12/2015 | Seo | |
| 9,282,264 B2 | 3/2016 | Park et al. | |
| 9,363,454 B2 | 6/2016 | Ito et al. | |
| 9,560,296 B2 | 1/2017 | Hseih et al. | |
| 9,646,681 B1 | 5/2017 | Jung et al. | |
| 9,723,233 B2 | 8/2017 | Grauer et al. | |
| 9,743,024 B2 | 8/2017 | Tyrrell et al. | |
| 9,826,175 B2 | 11/2017 | Sobe | |
| 9,832,370 B2 | 11/2017 | Cho et al. | |
| 9,912,885 B2 | 3/2018 | Isobe | |
| 9,955,091 B1 | 4/2018 | Dai et al. | |
| 10,007,350 B1 | 6/2018 | Holz et al. | |
| 10,090,342 B1 | 10/2018 | Gambino et al. | |
| 10,096,631 B2 | 10/2018 | Ishizu | |
| 10,154,221 B2 | 12/2018 | Ogino et al. | |
| 10,157,951 B2 | 12/2018 | Kim et al. | |
| 10,274,730 B2 | 4/2019 | Jepsen et al. | |
| 10,321,081 B2 | 6/2019 | Watanabe et al. | |
| 10,345,447 B1 | 7/2019 | Hicks | |
| 10,484,628 B2 * | 11/2019 | Zhang .................. H04N 5/355 |
| 10,515,284 B2 | 12/2019 | Gousev et al. | |
| 10,594,974 B2 | 3/2020 | Ivarsson et al. | |
| 10,607,413 B1 | 3/2020 | Marcolina et al. | |
| 10,715,824 B2 | 7/2020 | Tall et al. | |
| 10,726,627 B2 | 7/2020 | Liu | |
| 10,867,655 B1 | 12/2020 | Harms et al. | |
| 10,897,586 B2 * | 1/2021 | Liu ........................ H04N 5/353 |
| 10,915,995 B2 | 2/2021 | Moloney | |
| 10,939,062 B2 | 3/2021 | Ogawa et al. | |
| 10,970,619 B1 | 4/2021 | Xiao et al. | |
| 10,984,235 B2 | 4/2021 | Gousev et al. | |
| 10,999,539 B2 | 5/2021 | Wendel et al. | |
| 11,057,581 B2 * | 6/2021 | Liu ........................ H04N 5/365 |
| 11,126,497 B2 | 9/2021 | Oh et al. | |
| 11,204,835 B2 | 12/2021 | Lu et al. | |
| 11,568,609 B1 | 1/2023 | Liu et al. | |
| 11,630,724 B2 | 4/2023 | Shin et al. | |
| 11,825,228 B2 * | 11/2023 | Berkovich ............. H04N 25/75 |
| 11,888,002 B2 * | 1/2024 | Berkovich ............. H04N 23/65 |
| 11,910,114 B2 * | 2/2024 | Berkovich ............. H04N 25/75 |
| 2002/0113886 A1 | 8/2002 | Hynecek | |
| 2003/0005231 A1 | 1/2003 | Ooi et al. | |
| 2003/0020100 A1 | 1/2003 | Guidash | |
| 2005/0057389 A1 | 3/2005 | Krymski | |
| 2005/0058773 A1 | 3/2005 | Hasei et al. | |
| 2005/0073874 A1 | 4/2005 | Chan et al. | |
| 2005/0237380 A1 | 10/2005 | Kakii et al. | |
| 2006/0224792 A1 | 10/2006 | Ooi | |
| 2007/0076109 A1 | 4/2007 | Krymski | |
| 2007/0222881 A1 | 9/2007 | Mentzer | |
| 2008/0007731 A1 | 1/2008 | Botchway et al. | |
| 2008/0055736 A1 | 3/2008 | Tsuji et al. | |
| 2008/0226170 A1 | 9/2008 | Sonoda | |
| 2009/0033588 A1 | 2/2009 | Kajita et al. | |
| 2009/0245637 A1 | 10/2009 | Barman et al. | |
| 2010/0194956 A1 | 8/2010 | Yuan et al. | |
| 2010/0197821 A1 | 8/2010 | Jeong et al. | |
| 2010/0197876 A1 | 8/2010 | Lyu et al. | |
| 2010/0245600 A1 | 9/2010 | Chang et al. | |
| 2010/0276572 A1 | 11/2010 | Iwabuchi | |
| 2011/0055461 A1 | 3/2011 | Steiner et al. | |
| 2011/0075470 A1 | 3/2011 | Liaw | |
| 2011/0155892 A1 | 6/2011 | Neter et al. | |
| 2011/0254986 A1 | 10/2011 | Nishimura et al. | |
| 2011/0267362 A1 | 11/2011 | Handschy et al. | |
| 2012/0002459 A1 | 1/2012 | Rimondi et al. | |
| 2012/0002460 A1 | 1/2012 | Rimondi et al. | |
| 2012/0044399 A1 | 2/2012 | Hirai et al. | |
| 2012/0086082 A1 | 4/2012 | Malinge et al. | |
| 2012/0105475 A1 | 5/2012 | Tseng | |
| 2012/0105668 A1 | 5/2012 | Velarde et al. | |
| 2012/0113119 A1 | 5/2012 | Massie | |
| 2012/0133807 A1 | 5/2012 | Wu et al. | |
| 2012/0161088 A1 | 6/2012 | Choi et al. | |
| 2012/0198312 A1 | 8/2012 | Kankani et al. | |
| 2012/0200499 A1 | 8/2012 | Osterhout et al. | |
| 2012/0212465 A1 | 8/2012 | White et al. | |
| 2012/0240007 A1 | 9/2012 | Barndt et al. | |
| 2012/0262616 A1 | 10/2012 | Sa et al. | |
| 2013/0056809 A1 | 3/2013 | Mao et al. | |
| 2013/0057742 A1 | 3/2013 | Nakamura et al. | |
| 2013/0068929 A1 | 3/2013 | Solhusvik et al. | |
| 2013/0069787 A1 | 3/2013 | Petrou | |
| 2013/0120642 A1 | 5/2013 | Kim | |
| 2013/0141619 A1 | 6/2013 | Lim et al. | |
| 2013/0185609 A1 | 7/2013 | Park et al. | |
| 2013/0187027 A1 | 7/2013 | Qiao et al. | |
| 2013/0198577 A1 | 8/2013 | Oh et al. | |
| 2013/0207219 A1 | 8/2013 | Ahn | |
| 2013/0215290 A1 | 8/2013 | Solhusvik et al. | |
| 2013/0293753 A1 | 11/2013 | Keelan et al. | |
| 2013/0299674 A1 | 11/2013 | Fowler et al. | |
| 2013/0300009 A1 | 11/2013 | Oganesian et al. | |
| 2013/0314591 A1 | 11/2013 | Eromaki | |
| 2013/0326116 A1 | 12/2013 | Goss et al. | |
| 2014/0042299 A1 | 2/2014 | Wan et al. | |
| 2014/0055635 A1 | 2/2014 | Seo | |
| 2014/0063250 A1 | 3/2014 | Park | |
| 2014/0170345 A1 | 6/2014 | Aoshima et al. | |
| 2014/0247382 A1 | 9/2014 | Moldovan et al. | |
| 2014/0368687 A1 | 12/2014 | Yu et al. | |
| 2015/0050479 A1 | 2/2015 | Nakamura et al. | |
| 2015/0050480 A1 | 2/2015 | Suzuki et al. | |
| 2015/0085134 A1 | 3/2015 | Novotny et al. | |
| 2015/0158259 A1 | 6/2015 | Yamamoto et al. | |
| 2015/0189209 A1 | 7/2015 | Yang et al. | |
| 2015/0201142 A1 | 7/2015 | Smith et al. | |
| 2015/0222827 A1 | 8/2015 | Isobe | |
| 2015/0229859 A1 | 8/2015 | Guidash et al. | |
| 2015/0279884 A1 | 10/2015 | Kusumoto | |
| 2015/0309311 A1 | 10/2015 | Cho | |
| 2015/0309316 A1 | 10/2015 | Osterhout et al. | |
| 2015/0312502 A1 | 10/2015 | Borremans | |
| 2015/0358571 A1 | 12/2015 | Dominguez Castro et al. | |
| 2015/0381911 A1 | 12/2015 | Shen et al. | |
| 2016/0011422 A1 | 1/2016 | Thurber et al. | |

(56) References Cited

U.S. PATENT DOCUMENTS

| | | |
|---|---|---|
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0032074 A1 | 2/2016 | Aizenberg et al. |
| 2016/0048964 A1 | 2/2016 | Kruglick |
| 2016/0078614 A1 | 3/2016 | Ryu et al. |
| 2016/0088253 A1 | 3/2016 | Tezuka |
| 2016/0100115 A1 | 4/2016 | Kusano |
| 2016/0105656 A1 | 4/2016 | Lin et al. |
| 2016/0117829 A1 | 4/2016 | Yoon et al. |
| 2016/0165160 A1 | 6/2016 | Hseih et al. |
| 2016/0210785 A1 | 7/2016 | Balachandreswaran et al. |
| 2016/0256039 A1 | 9/2016 | Fukunaga |
| 2016/0295148 A1 | 10/2016 | Lin et al. |
| 2016/0344965 A1 | 11/2016 | Grauer et al. |
| 2016/0360127 A1 | 12/2016 | Dierickx et al. |
| 2017/0039906 A1 | 2/2017 | Jepsen |
| 2017/0041571 A1 | 2/2017 | Tyrrell et al. |
| 2017/0117310 A1 | 4/2017 | Tatani et al. |
| 2017/0154909 A1 | 6/2017 | Ishizu |
| 2017/0161579 A1 | 6/2017 | Gousev et al. |
| 2017/0228345 A1 | 8/2017 | Gupta et al. |
| 2017/0248789 A1 | 8/2017 | Yokoyama |
| 2017/0270664 A1 | 9/2017 | Hoogi et al. |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0307887 A1 | 10/2017 | Stenberg et al. |
| 2017/0310910 A1* | 10/2017 | Smith .................. H04N 5/3559 |
| 2017/0338262 A1 | 11/2017 | Hirata |
| 2017/0339327 A1 | 11/2017 | Koshkin et al. |
| 2018/0027174 A1 | 1/2018 | Sengoku |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0167575 A1 | 6/2018 | Watanabe et al. |
| 2018/0176545 A1 | 6/2018 | Aflaki Beni |
| 2018/0204867 A1 | 7/2018 | Kim et al. |
| 2018/0211582 A1 | 7/2018 | Sakariya et al. |
| 2018/0224658 A1 | 8/2018 | Teller |
| 2018/0239108 A1 | 8/2018 | Ishii et al. |
| 2018/0241953 A1 | 8/2018 | Johnson |
| 2018/0252857 A1 | 9/2018 | Glik et al. |
| 2018/0270436 A1 | 9/2018 | Ivarsson et al. |
| 2018/0276841 A1 | 9/2018 | Krishnaswamy et al. |
| 2018/0284594 A1 | 10/2018 | Gao |
| 2018/0288344 A1 | 10/2018 | Chu et al. |
| 2019/0019023 A1 | 1/2019 | Konttori et al. |
| 2019/0027454 A1 | 1/2019 | Chen et al. |
| 2019/0035154 A1 | 1/2019 | Liu |
| 2019/0046044 A1 | 2/2019 | Tzvieli et al. |
| 2019/0098232 A1 | 3/2019 | Mori et al. |
| 2019/0110039 A1 | 4/2019 | Linde et al. |
| 2019/0123088 A1 | 4/2019 | Kwon |
| 2019/0149751 A1 | 5/2019 | Wise |
| 2019/0172227 A1 | 6/2019 | Kasahara |
| 2019/0191116 A1 | 6/2019 | Madurawe |
| 2019/0199946 A1 | 6/2019 | Wendel et al. |
| 2019/0204527 A1 | 7/2019 | Nakajima |
| 2019/0246036 A1 | 8/2019 | Wu et al. |
| 2019/0253650 A1 | 8/2019 | Kim |
| 2019/0307313 A1 | 10/2019 | Wade |
| 2019/0331914 A1 | 10/2019 | Lee et al. |
| 2019/0361250 A1 | 11/2019 | Lanman et al. |
| 2019/0363118 A1 | 11/2019 | Berkovich et al. |
| 2020/0035661 A1 | 1/2020 | Yu et al. |
| 2020/0053299 A1 | 2/2020 | Zhang et al. |
| 2020/0098096 A1 | 3/2020 | Moloney |
| 2020/0193206 A1 | 6/2020 | Turkelson et al. |
| 2020/0195828 A1* | 6/2020 | Reyserhove ......... H04N 5/2353 |
| 2020/0195875 A1 | 6/2020 | Berkovich et al. |
| 2020/0228740 A1 | 7/2020 | Otaka |
| 2020/0273784 A1 | 8/2020 | Mallik et al. |
| 2020/0280689 A1 | 9/2020 | Takahashi et al. |
| 2021/0026796 A1 | 1/2021 | Graif et al. |
| 2021/0044742 A1* | 2/2021 | Berkovich ............. H04N 25/50 |
| 2021/0075982 A1 | 3/2021 | Wojciechowski et al. |
| 2021/0084249 A1 | 3/2021 | Nakazawa et al. |
| 2021/0110187 A1 | 4/2021 | Pillai et al. |
| 2021/0118847 A1 | 4/2021 | Chuang et al. |
| 2021/0142086 A1 | 5/2021 | Berkovich et al. |
| 2021/0144326 A1 | 5/2021 | Sato et al. |
| 2021/0152758 A1 | 5/2021 | Muraoka |
| 2021/0185199 A1 | 6/2021 | Schneider, Jr. et al. |
| 2021/0185264 A1 | 6/2021 | Wong et al. |
| 2021/0227159 A1 | 7/2021 | Sambonsugi |
| 2021/0264679 A1 | 8/2021 | Liu et al. |
| 2021/0281794 A1 | 9/2021 | Yoda |
| 2021/0283871 A1 | 9/2021 | Lee et al. |
| 2021/0289156 A1 | 9/2021 | Hanzawa et al. |
| 2021/0306586 A1 | 9/2021 | Yamamoto et al. |
| 2021/0337148 A1 | 10/2021 | Powell |
| 2021/0368124 A1* | 11/2021 | Berkovich ........... H04N 5/3745 |
| 2021/0377496 A1 | 12/2021 | Kim et al. |
| 2021/0409625 A1* | 12/2021 | Zhu ........................ H04N 5/351 |
| 2022/0021833 A1* | 1/2022 | Berkovich ............. H04N 5/378 |
| 2022/0076726 A1 | 3/2022 | Hulton et al. |
| 2023/0239582 A1* | 7/2023 | Berkovich ............. H04N 25/78 |

FOREIGN PATENT DOCUMENTS

| | | |
|---|---|---|
| CN | 103907133 A | 7/2014 |
| CN | 104204904 A | 12/2014 |
| CN | 106255978 A | 12/2016 |
| CN | 106791504 A | 5/2017 |
| CN | 107005641 A | 8/2017 |
| CN | 109298528 A | 2/2019 |
| DE | 102015122055 A1 | 6/2017 |
| EP | 0775591 A2 | 5/1997 |
| EP | 1603170 A1 | 12/2005 |
| EP | 1746820 A1 | 1/2007 |
| EP | 1788802 A1 | 5/2007 |
| EP | 2037505 A1 | 3/2009 |
| EP | 2228846 A1 | 9/2010 |
| EP | 2330173 A2 | 6/2011 |
| EP | 2357679 A2 | 8/2011 |
| EP | 2804074 A2 | 11/2014 |
| EP | 3229457 A1 | 10/2017 |
| EP | 3833005 A1 | 6/2021 |
| JP | 2003319262 A | 11/2003 |
| JP | 2005129139 A | 5/2005 |
| JP | 2006113139 A | 4/2006 |
| JP | 2006348085 A | 12/2006 |
| JP | 2008270500 A | 11/2008 |
| JP | 2013043383 A | 3/2013 |
| JP | 2014531820 A | 11/2014 |
| JP | 2017060155 A | 3/2017 |
| KR | 20110100974 A | 9/2011 |
| WO | 2006022077 A1 | 3/2006 |
| WO | 2014055391 A2 | 4/2014 |
| WO | 2016042734 A1 | 3/2016 |
| WO | 2016088840 A1 | 6/2016 |
| WO | 2016095057 A1 | 6/2016 |
| WO | 2017003477 | 1/2017 |
| WO | 2017013806 A1 | 1/2017 |
| WO | 2017047010 A1 | 3/2017 |
| WO | 2018231962 A1 | 12/2018 |
| WO | 2019018084 A1 | 1/2019 |
| WO | 2019111528 A1 | 6/2019 |
| WO | 2019145578 A1 | 8/2019 |
| WO | 2019178060 A1 | 9/2019 |
| WO | 2019244142 A2 | 12/2019 |
| WO | 2020077283 A1 | 4/2020 |

OTHER PUBLICATIONS

PCT/US2020/044807, "International Search Report and Written Opinion", dated Sep. 30, 2020, 12 pages.

PCT/US2020/059636, "International Search Report and Written Opinion", dated Feb. 11, 2021, 18 pages.

U.S. Appl. No. 16/715,792, "Non-Final Office Action", dated Jan. 1, 2021, 15 pages.

(56) References Cited

OTHER PUBLICATIONS

PCT/US2019/066805, "International Search Report and Written Opinion", dated Mar. 6, 2020, 13 pages.
PCT/US2019/066831, "International Search Report and Written Opinion", dated Feb. 27, 2020, 15 pages.
International Application No. PCT/US2019/034007, International Search Report and Written Opinion dated Oct. 28, 2019, 19 pages.
U.S. Appl. No. 16/716,050, "Non-Final Office Action", dated May 14, 2021, 16 pages.
U.S. Appl. No. 17/083,920, "Final Office Action", dated Jul. 28, 2021, 19 pages.
U.S. Appl. No. 17/083,920, "Non-Final Office Action", dated Apr. 21, 2021, 17 pages.
U.S. Appl. No. 16/715,792, "Notice of Allowance", dated Aug. 25, 2021, 9 pages.
U.S. Appl. No. 17/083,920, "Advisory Action", dated Oct. 1, 2021, 4 pages.
PCT/US2021/033321, "International Search Report and Written Opinion", dated Sep. 6, 2021, 11 pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a col. Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.
Corrected Notice of Allowability dated Apr. 9, 2021 for U.S. Appl. No. 16/255,528, filed Jan. 23, 2019, 5 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 19743908.6, dated Sep. 30, 2020, 9 Pages.
Final Office Action dated Oct. 18, 2021 for U.S. Appl. No. 16/716,050, filed Dec. 16, 2019, 18 Pages.
Final Office Action dated Jan. 27, 2021 for U.S. Appl. No. 16/255,528, filed Jan. 23, 2019, 31 Pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2020/058097, dated Feb. 12, 2021, 09 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
Millet L., et al., "A 5500-Frames/s 85-GOPS/W 3-D Stacked BSI Vision Chip Based on Parallel in-Focal-Plane Acquisition and Processing," IEEE Journal of Solid-State Circuits, USA, Apr. 1, 2019, vol. 54 (4), pp. 1096-1105, XP011716786.
Non-Final Office Action dated Sep. 2, 2021 for U.S. Appl. No. 16/910,844, filed Jun. 24, 2020, 7 Pages.
Non-Final Office Action dated Jul. 10, 2020 for U.S. Appl. No. 16/255,528, filed Jan. 23, 2019, 27 Pages.
Non-Final Office Action dated Oct. 21, 2021 for U.S. Appl. No. 17/083,920, filed Oct. 29, 2020, 19 Pages.
Non-Final Office Action dated Nov. 23, 2018 for U.S. Appl. No. 15/847,517, filed Dec. 19, 2017, 21 Pages.
Non-Final Office Action dated Jul. 25, 2019 for U.S. Appl. No. 15/909,162, filed Mar. 1, 2018, 20 Pages.
Notice of Allowance dated Apr. 1, 2021 for U.S. Appl. No. 16/255,528, filed Jan. 23, 2019, 7 Pages.
Notice of Allowance dated Mar. 18, 2020 for U.S. Appl. No. 15/909,162, filed Mar. 1, 2018, 9 Pages.
Notice of Allowance dated Dec. 22, 2021 for U.S. Appl. No. 16/910,844, filed Jun. 24, 2020, 7 pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Office Action dated Jul. 3, 2020 for Chinese Application No. 201810821296, filed Jul. 24, 2018, 17 Pages.
Office Action dated Mar. 9, 2021 for Chinese Application No. 201810821296, filed Jul. 24, 2018, 10 Pages.
Office Action dated Jun. 28, 2020 for Chinese Application No. 201810821296, filed Jul. 24, 2018, 2 Pages.
Partial European Search Report for European Application No. 18179838.0, dated Dec. 5, 2018, 13 Pages.
Restriction Requirement dated Feb. 2, 2021 for U.S. Appl. No. 16/716,050, filed Dec. 16, 2019, 7 Pages.
Sebastian A., et al., "Memory Devices and Applications for in-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Advisory Action dated Oct. 1, 2021 for U.S. Appl. No. 17/083,920, filed Oct. 29, 2020, 4 pages.
International Preliminary Report on Patentability for International Application No. PCT/US2020/044807, dated Feb. 17, 2022, 10 pages.
Notice of Allowance dated Feb. 14, 2022 for U.S. Appl. No. 16/715,792, filed Dec. 16, 2019, 9 pages.
Notice of Allowance dated Feb. 22, 2022 for U.S. Appl. No. 17/083,920, filed Oct. 29, 2020, 10 pages.
Notice of Allowance mailed May 23, 2022 for U.S. Appl. No. 17/324,803, filed May 19, 2021, 9 pages.
Notice of Allowance mailed May 24, 2022 for U.S. Appl. No. 16/715,792, filed Dec. 16, 2019, 9 pages.
Office Action mailed Apr. 5, 2022 for European Patent Application No. 19731047.7, filed May 24, 2019, 7 pages.
Invitation to Pay Additional Fees and Where Applicable, Protest Fee for International Application No. PCT/US2021/041775, Oct. 8, 2021, 12 pages.
Notice of Allowance mailed Jun. 17, 2022 for U.S. Appl. No. 16/715,792, filed Dec. 16, 2019, 2 pages.
Notice of Allowance mailed Jun. 2, 2022 for U.S. Appl. No. 16/716,050, filed Dec. 16, 2019, 13 pages.
Notice of Allowance mailed Jun. 3, 2022 for U.S. Appl. No. 17/324,803, filed May 19, 2021, 6 pages.
Office Action mailed Aug. 11, 2022 for European Patent Application No. 19731047.7, filed May 24, 2019, 10 pages.
Notice of Allowance mailed Sep. 2, 2022 for U.S. Appl. No. 16/715,792, filed Dec. 16, 2019, 9 pages.
Notice of Allowance mailed Sep. 8, 2022 for U.S. Appl. No. 17/324,803, filed May 19, 2021, 8 pages.
Notice of Allowance mailed Sep. 9, 2022 for U.S. Appl. No. 17/083,920, filed Oct. 29, 2020, 10 pages.
Notice of Allowance mailed Sep. 9, 2022 for U.S. Appl. No. 17/091,331, filed Nov. 6, 2020, 2 pages.
Notice of Allowance mailed Sep. 19, 2022 for U.S. Appl. No. 16/716,050, filed Dec. 16, 2019, 13 pages.
Notice of Allowance mailed Aug. 24, 2022 for U.S. Appl. No. 17/091,331, filed Nov. 6, 2020, 9 pages.
Notice of Allowance mailed Sep. 28, 2022 for U.S. Appl. No. 16/716,050, filed Dec. 16, 2019, 6 pages.

(56) References Cited

OTHER PUBLICATIONS

Office Action mailed Aug. 17, 2022 for Chinese Application No. 201980083991.5, filed Jun. 17, 2021, 24 pages.
Office Action mailed Jul. 29, 2022 for Taiwan Application No. 108118209, filed May 27, 2019, 15 pages.
Final Office Action mailed Oct. 6, 2022 for U.S. Appl. No. 17/127,670, filed Dec. 18, 2020, 20 pages.
International Search Report and Written Opinion for International Application No. PCT/US2022/034259, mailed Oct. 21, 2022, 10 pages.
Non-Final Office Action mailed Nov. 2, 2022 for U.S. Appl. No. 16/983,863, filed Aug. 3, 2020, 20 pages.
Non-Final Office Action mailed Feb. 2, 2023 for U.S. Appl. No. 17/469,258, filed Sep. 8, 2021, 17 pages.
Non-Final Office Action mailed Mar. 6, 2023 for U.S. Appl. No. 17/992,648, filed Nov. 22, 2022, 24 pages.
Notice of Allowance mailed Feb. 7, 2023 for U.S. Appl. No. 17/083,920, filed Oct. 29, 2020, 10 pages.
Notice of Allowance mailed Feb. 8, 2023 for U.S. Appl. No. 17/324,803, filed May 19, 2021, 8 pages.
Notice of Allowance mailed Jan. 26, 2023 for U.S. Appl. No. 16/716,050, filed Dec. 16, 2019, 14 pages.
Office Action mailed Feb. 11, 2023 for Chinese Application No. 201980048866.0, filed May 24, 2019, 20 Pages.
Office Action mailed Feb. 13, 2023 for Taiwan Application No. 108146255, filed Dec. 17, 2019, 30 pages.
Amir M.F., et al., "NeuroSensor: A 3D Image Sensor with Integrated Neural Accelerator," IEEE SOI-3D-Subthreshold Microelectronics Technology Unified Conference (S3S), Oct. 2016, pp. 1-2.
Corrected Notice of Allowance mailed Apr. 18, 2023 for U.S. Appl. No. 17/127,670, filed Mar. 5, 2021, 2 pages.
Final Office Action mailed Apr. 12, 2023 for U.S. Appl. No. 16/983,863, filed Aug. 3, 2020, 21 pages.
International Search Report and Written Opinion for International Application No. PCT/US2023/011630, mailed Apr. 6, 2023, 10 pages.
Non-Final Office Action mailed Jun. 30, 2023 for U.S. Appl. No. 17/556,436, filed Dec. 20, 2021, 25 pages.
Notice of Allowance mailed Jun. 7, 2023 for U.S. Appl. No. 16/716,050, filed Dec. 16, 2019, 18 pages.
Notice of Allowance mailed Jul. 18, 2023 for U.S. Appl. No. 17/091,331, filed Nov. 6, 2020, 7 pages.
Notice of Allowance mailed Apr. 19, 2023 for U.S. Appl. No. 16/715,792, filed Dec. 16, 2019, 9 pages.
Notice of Allowance mailed May 22, 2023 for U.S. Appl. No. 17/324,803, filed May 19, 2021, 5 pages.
Notice of Allowance mailed Mar. 27, 2023 for U.S. Appl. No. 17/127,670, filed Dec. 18, 2020, 9 pages.
Notice of Allowance mailed Mar. 28, 2023 for U.S. Appl. No. 17/091,331, filed Nov. 6, 2020, 5 pages.
Office Action mailed Mar. 14, 2023 for Taiwan Application No. 108146257, filed Dec. 17, 2019, 25 pages.
Office Action mailed Mar. 23, 2023 for Chinese Application No. 201980083991.5, filed Jun. 17, 2021, 21 pages.
Corrected Notice of Allowance mailed Oct. 13, 2023 for U.S. Appl. No. 17/324,803, filed May 19, 2021, 2 pages.
Devlin N.R., et al., "Patterning Decomposable Polynorbornene with Electron Beam Lithography to Create Nanochannels," Journal of Vacuum Science and Technology, vol. 27, No. 6, Dec. 1, 2009, pp. 2508-2511.
Dong J., et al., "Self-Assembly of Highly Stable Zirconium(IV) Coordination Cages with Aggregation Induced Emission Molecular Rotors for Live-Cell Imaging," Angewandte Chemie International Edition, vol. 59, No. 25, Jun. 15, 2020, 10 pages.
Final Office Action mailed Sep. 25, 2023 for U.S. Appl. No. 17/469,258, filed Sep. 8, 2021, 17 pages.
International Preliminary Report on Patentability for International Application No. PCT/US2020/058439, mailed Jun. 23, 2022, 11 pages.
International Preliminary Report on Patentability for International Application No. PCT/US2020/059560, mailed Jun. 16, 2022, 8 pages.
International Preliminary Report on Patentability for International Application No. PCT/US2020/061218, mailed Jun. 9, 2022, 9 pages.
International Preliminary Report on Patentability for International Application No. PCT/US2020/062991, mailed Jul. 7, 2022, 8 pages.
International Preliminary Report on Patentability for International Application No. PCT/US2020/066992, mailed Jul. 7, 2022, 27 pages.
International Preliminary Report on Patentability for International Application No. PCT/US2021/014970, mailed Sep. 9, 2022, 7 pages.
International Preliminary Report on Patentability for International Application No. PCT/US2021/016158, mailed Aug. 18, 2022, 7 pages.
International Search Report and Written Opinion for International Application No. PCT/US2020/056758, mailed Feb. 17, 2021, 11 Pages.
International Search Report and Written Opinion for International Application No. PCT/US2020/058439, mailed Apr. 6, 2021, 16 Pages.
International Search Report and Written Opinion for International Application No. PCT/US2020/059560, mailed Feb. 9, 2021, 9 Pages.
International Search Report and Written Opinion for International Application No. PCT/US2020/061218, mailed Feb. 16, 2021, 11 pages.
International Search Report and Written Opinion for International Application No. PCT/US2020/062991, mailed Feb. 24, 2021, 9 Pages.
International Search Report and Written Opinion for International Application No. PCT/US2020/066992, mailed May 17, 2021, 31 Pages.
International Search Report and Written Opinion for International Application No. PCT/US2021/014970, mailed Apr. 26, 2021, 8 Pages.
Khaled S.R., "A Review of Piezoelectric Polymers as Functional Materials for Electromechanical Transducers," Smart Materials and Structures, IOP Publishing LTD, Bristol, GB, Jan. 20, 2014 [retrieved on Jan. 20, 2014], vol. 23 (3), Article 33001, 29 pages, XP020258249, ISSN: 0964-1726, DOI: 10.1088/0964-1726/23/3/033001.
Levola T., "Diffractive Optics for Virtual Reality Displays," Journal of the Society for Information Display—SID, May 2006, vol. 14 (5), pp. 467-475, XP008093627.
Non-Final Office Action mailed Dec. 8, 2023 for U.S. Appl. No. 17/645,904, filed Dec. 23, 2021, 19 pages.
Non-Final Office Action mailed Nov. 14, 2023 for U.S. Appl. No. 16/983,863, filed Aug. 3, 2020, 10 pages.
Non-Final Office Action mailed Jul. 22, 2021 for U.S. Appl. No. 16/834,605, filed Mar. 30, 2020, 12 pages.
Notice of Allowance mailed Nov. 1, 2023 for U.S. Appl. No. 17/091,331, filed Nov. 6, 2020, 7 pages.
Notice of Allowance mailed Dec. 12, 2023 for U.S. Appl. No. 17/992,648, filed Nov. 22, 2022, 10 pages.
Notice of Allowance mailed Sep. 12, 2023 for U.S. Appl. No. 17/324,803, filed May 19, 2021, 2 pages.
Notice of Allowance mailed Nov. 15, 2023 for U.S. Appl. No. 17/083,920, filed Oct. 29, 2020, 12 pages.
Notice of Allowance mailed Sep. 15, 2023 for U.S. Appl. No. 16/716,050, filed Dec. 16, 2019, 18 pages.
Notice of Allowance mailed Aug. 16, 2023 for U.S. Appl. No. 16/715,792, filed Dec. 16, 2019, 9 pages.
Notice of Allowance mailed Nov. 16, 2023 for U.S. Appl. No. 17/556,436, filed Dec. 20, 2021, 8 pages.
Notice of Allowance mailed Aug. 22, 2023 for U.S. Appl. No. 17/992,648, filed Nov. 22, 2022, 10 pages.
Notice of Allowance mailed Mar. 22, 2022 for U.S. Appl. No. 16/834,605, filed Mar. 30, 2020, 8 pages.
Notice of Allowance mailed Aug. 30, 2023 for U.S. Appl. No. 17/324,803, filed May 19, 2021, 5 pages.

(56) References Cited

OTHER PUBLICATIONS

Notice of Allowance mailed May 31, 2022 for U.S. Appl. No. 16/706,859, filed Dec. 9, 2019, 13 pages.
Office Action mailed Sep. 5, 2023 for Japanese Patent Application No. 2020-561752, filed on Nov. 2, 2020, 5 pages.
Office Action mailed Dec. 7, 2023 for Chinese Application No. 201980092371.8, filed Dec. 17, 2019, 7 pages.
Office Action mailed Dec. 7, 2023 for Chinese Application No. 202080047086.7, filed Aug. 4, 2020, 7 pages.
Office Action mailed Dec. 12, 2023 for Japanese Patent Application No. 2021-526520, filed on Dec. 17, 2019, 5 pages.
Office Action mailed Sep. 20, 2023 for Taiwan Application No. 109139740, filed Nov. 13, 2020, 17 pages.
Office Action mailed Dec. 26, 2023 for Japanese Patent Application No. 2021-531109, filed on May 31, 2021, 2 pages.

* cited by examiner

PROGRAMMABLE PIXEL ARRAY

RELATED APPLICATION

This patent application claims priority to U.S. Provisional Patent Application Ser. No. 62/676,849, filed May 25, 2018, entitled "SMART SENSOR FOR MODEL-PREDICTIVE CAPTURE," which is assigned to the assignee hereof and is incorporated herein by reference in its entirety for all purposes.

BACKGROUND

The disclosure relates generally to image sensors, and more specifically to image sensors comprising a programmable pixel array.

A typical image sensor includes an array of pixel cells. Each pixel cell may include a photodiode to sense light by converting photons into charge (e.g., electrons or holes). The charge converted at each pixel cell can be quantized to become a digital pixel value, and an image can be generated from an array of digital pixel values. Many applications may require the image sensor to provide high-resolution images and/or at high frame rates.

SUMMARY

The present disclosure relates to image sensors. More specifically, and without limitation, this disclosure relates to an image sensor having a programmable pixel cell array.

In one example, an apparatus comprises: an array of pixel cells, each pixel cell of the array of pixel cells configured to perform a light measurement operation and to generate a digital output of the light measurement operation; a peripheral circuit configured to: receive a pixel array programming map including programming data targeted at each pixel cell of the array of pixel cells; and configure the light measurement operation at the each pixel cell based on the programming data targeted at the each pixel cell; and an image processor configured to generate an image frame based on the digital outputs of at least some of the array of pixel cells.

In some aspects, the each pixel cell of the array of pixel cells is associated with a configuration memory that is individually addressable. The peripheral circuit is configured to: extract first programming data for a first pixel cell of the array of pixel cells from the pixel array programming map; extract second programming data for a second pixel cell of the array of pixel cells from the pixel array programming map; generate a first address based on the first programming data; generate a second address based on the second programming data; select, based on the first address, the configuration memory of the first pixel cell to receive the first programming data; and select, based on the second address, the configuration memory of the second pixel cell to receive the second programming data. The first programming data and the second programming data are different.

In some aspects, the pixel array programming map comprises an array of programming data. The first address is generated based on a location of the first programming data within the array of programming data.

In some aspects, the each pixel cell includes at least one device to control the generation of the digital output. The peripheral circuit is configured to: transmit, based on the first address, a first signal to the at least one device switch of the first pixel cell to enable the generation of a first digital output at the first pixel cell; and transmit, based on the second address, a second signal to the at least one device of the second pixel cell to disable the generation of a second digital output at the second pixel cell.

In some aspects, the peripheral circuit is configured to disable one or more sense amplifiers configured to amplify the second digital output based on the second address.

In some aspects, the peripheral circuit is configured to output a stream of digital outputs including the first digital output to the image processor. The image processor is configured to: synchronize timing of reception of the stream of digital outputs based on the pixel array programming map; and identify the first digital output from the stream of digital outputs based on the synchronization.

In some aspects, the first programming data and the second programming data are generated based on a region of interest determined from a prior image frame.

In some aspects, the each pixel cell is configured to perform the light measurement operation within a programmable exposure period. The peripheral circuit is configured to: transmit, based on the first address, a first signal to the first pixel cell to set a first exposure period for a first light measurement operation; and transmit, based on the second address, a second signal to the second pixel cell to set a second exposure period for a second light measurement operation, the second exposure period being different from the first exposure period. The image processor is configured to receive a first digital output of the first light measurement operation and a second digital output of the second light measurement operation.

In some aspects, the peripheral circuit is configured to transmit, based on the first address, the first signal to the first pixel cell to perform the first light measurement operation based on at least one of: setting the first exposure period to zero or putting the first pixel cell in a reset state. The image processor is configured to: perform a calibration operation based on the first digital output; and determine an intensity of light received by the second pixel cell based on the second digital output and a result of the calibration operation.

In some aspects, the each pixel cell is configured to generate an analog signal representing a result of the light measurement operation, the digital output being generated based on quantizing the analog signal at a programmable quantization resolution. The peripheral circuit is configured to: transmit, based on the first address, a first signal to the first pixel cell to set a first quantization resolution; and transmit, based on the second address, a second signal to the second pixel cell to set a second quantization resolution different from the first quantization resolution.

In some aspects, the each pixel cell includes a counter configured to generate the digital output based on comparing the analog signal with a ramping signal, the quantization resolution being programmable based on a frequency of a clock signal supplied to the counter. The peripheral circuit is configured to: transmit, based on the first address, a first clock signal of a first clock frequency to the first pixel cell to set the first quantization resolution; and transmit, based on the second address, a second clock signal of a second clock frequency to the second pixel cell to set the second quantization resolution.

In some aspects, the first pixel cell includes a summation circuit configured to generate a summation signal based on summing a first analog signal from a first light measurement operation at the first pixel cell and a second analog signal from a second light measurement operation at the second pixel cell. The peripheral circuit is configured to: transmit, based on the first address, a first signal to configure the first pixel cell to generate a first digital output based on quantizing the summation signal; and transmit, based on the second address, a second signal to the second pixel cell to disable generation of a second digital output by the second pixel cell.

In some aspects, the each pixel includes a first photodiode configured to measure light of a first wavelength range and a second photodiode to measure light of a second wave length range. The peripheral circuit is configured to: transmit, based on the first address, a first signal to the first pixel cell to generate a first digital output based on output from the first photodiode; and transmit, based on the second address, a second signal to the second pixel cell to generate a second digital output based on an output from the second photodiode.

In some aspects, the apparatus further comprises a post processor circuit configured to perform post processing of at least some of the digital outputs of the array of pixel cells. The image processor is configured to generate the image frame based on the post processed at least some of the digital outputs of the array of pixel cells. The post processor circuit, the peripheral circuit, and the array of pixel cells are integrated on a semiconductor substrate.

In some aspects, the array of pixel cells is formed on a first semiconductor substrate. At least one of the peripheral circuit and the post processor circuit is formed on a second semiconductor substrate. The first semiconductor substrate and the second semiconductor substrate forms a stack.

In some aspects, the post processor circuit is configured to: extract, from the at least some of the digital outputs of the array of pixel cells, features corresponding to reflection of structured light by an object; based on a result of the extraction, identify pixel cells of which the digital outputs represent the extracted features; and transmit only the digital outputs of the identified pixel cells to the image processor.

In some aspects, the post processor circuit is configured to: determine sub pixel locations of the extracted features; and provide the sub pixel locations to an application to perform a depth sensing operation of the object.

In some aspects, the post processor circuit comprises the image processor and is configured to: receive the digital outputs generated by the array of pixel cells at a first frame rate; and generate image frames based on the digital outputs at a second frame rate lower than the first frame rate.

In some aspects, the apparatus further comprises an illuminator configured to project light to different parts of a scene based on an illumination sequence. The pixel array programming map is generated based on the illumination sequence.

In some examples, a method is provided. The method comprises: receiving a pixel array programming map including programming data targeted at each pixel cell of an array of pixel cells; extracting first programming data for a first pixel cell of the array of pixel cells from the pixel array programming map; extracting second programming data for a second pixel cell of the array of pixel cells from the pixel array programming map; configuring a first light measurement operation at the first pixel cell based on the first programming data; configuring a second light measurement operation at the second pixel cell based on the second programming data; and generating an image frame based on pixel data output by at least one of the first pixel cell or the second pixel cell.

BRIEF DESCRIPTION OF THE DRAWINGS

Illustrative embodiments are described with reference to the following figures.

Figure 1A:
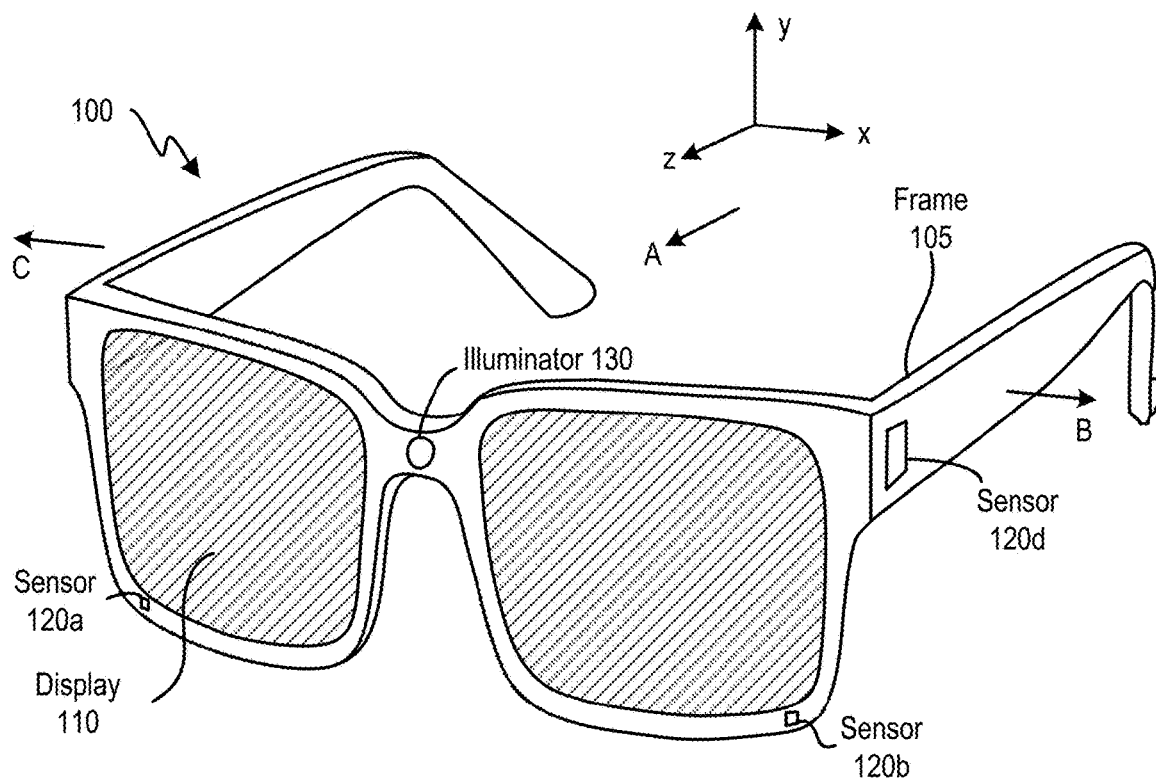
FIG. 1A and FIG. 1B are diagrams of an embodiment of a near-eye display.
Figure 1A:
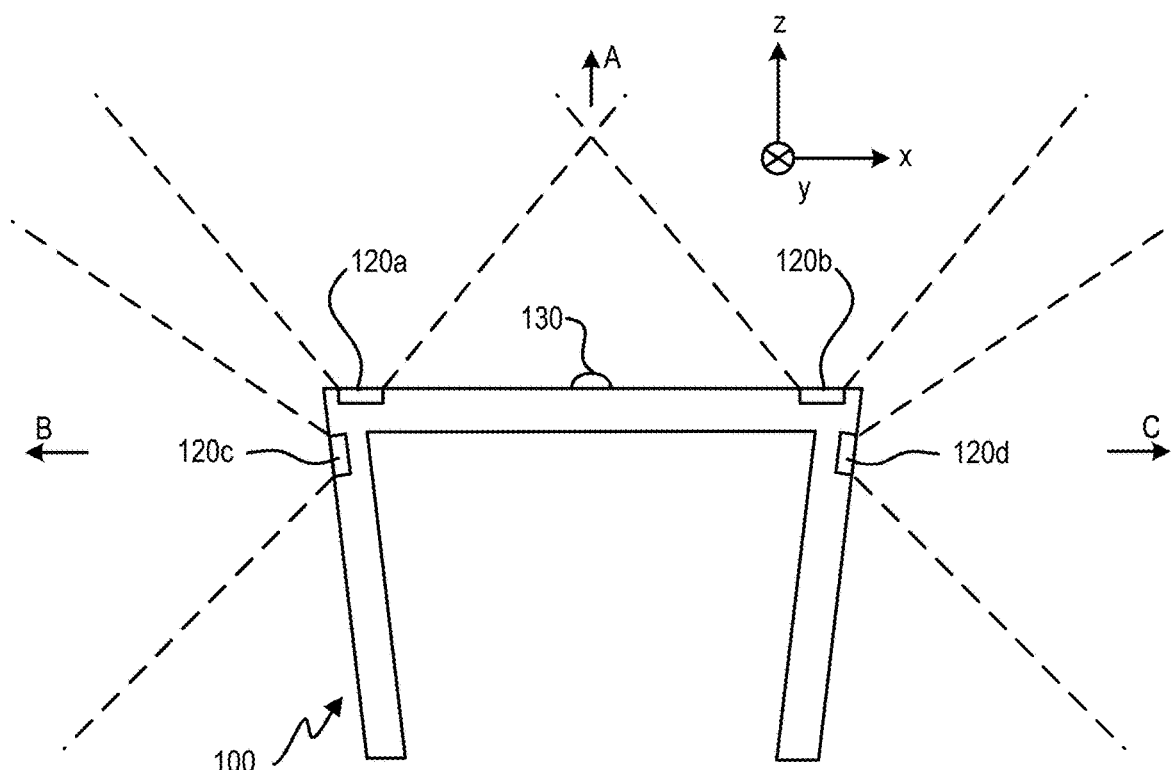

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes an array of pixel cells. Each pixel cell includes a photodiode to sense incident light by converting photons into charge (e.g., electrons or holes). The charge generated by photodiodes of the array of pixel cells can then be quantized by an analog-to-digital converter (ADC) into digital values. The ADC can quantize the charge by, for example, using a comparator to compare a voltage representing the charge with one or more quantization levels, and a digital value can be generated based on the comparison result. The digital values can then be stored in a memory to generate the image.

The image data from an image sensor can support various wearable applications, such as fusion of 2D and 3D sensing, object recognition and tracking, location tracking, etc. These applications can extract feature information from a subset of pixels of the image to perform computations. For example, to perform 3D sensing, an application can identify pixels of reflected structured light (e.g., dots), compare a pattern extracted from the pixels with the transmitted structured light, and perform depth computation based on the comparison. The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. These applications are typically executed on a host processor, which can be electrically connected with the image sensor and receive the pixel data via interconnects. The host processor, the image sensor, and the interconnects can be part of a wearable device.

All these applications can benefit from high-resolution images and/or high frame rates. Higher-resolution images allow the application to extract more detailed features/patterns (e.g., more refined patterns of reflected structured light, more detailed image features, etc.), whereas providing images generated at a higher frame rate enables an application to track the location of an object, the location of the wearable device, etc., at a higher sampling rate, both of which can improve the performances of the applications.

However, high-resolution images and high frame rates can lead to generation, transmission, and processing of a large volume of pixel data, which can present numerous challenges. For example, transmitting and processing a large volume of pixel data at a high data rate can lead to high power consumption at the image sensor, the interconnect, and the host processor. Moreover, the image sensor and the host processor may impose bandwidth limitations on and add latency to the generation and processing of large volumes of pixel data. The high power and high bandwidth requirement can be especially problematic for a wearable device which tends to operate with relatively low power and at a relatively low speed due to form factor and safety considerations.

This disclosure relates to an image sensor that can address at least some of the issues above. The image sensor comprises an array of pixel cells and a peripheral circuit. The image sensor can be electrically connected to a host processor via an interconnect. The image sensor, the host processor, and the interconnect can be included in a wearable device.

Each pixel cell of the array of pixel cells can perform a light measurement operation and generate pixel data representing the output of the light measurement operation. The peripheral circuit can receive a pixel array programming map including programming data targeted at each pixel cell of the array of pixel cells, and configure the light measurement operation at the each pixel cell based on the programming data targeted at the each pixel cell. In some examples, each pixel cell of the array of pixel cells may be associated with or include a configuration memory that is individually addressable. The peripheral circuit can extract programming data from the pixel array programming map and associate the extracted programming data targeted at each pixel cell with the address of the pixel cell. The peripheral circuit can transmit a control signal to each pixel cell to transmit the programming data to the configuration memory of each pixel cell to configure the light measurement operation at the each pixel cell based on the respective programming data. The host processor can receive the digital outputs of at least some of the array of pixel cells from the image sensor via the interconnect, and operate an application based on the received digital outputs.

The peripheral circuit can configure, based on the pixel array programming map, the array of pixel cells such that only a subset of the pixel cells generates and transmits pixel data, while the rest of the pixel cells can be turned off, set in a state where the generation of pixel data is disabled, to output pixel data with a lower bit-depth and/or a lower quantization resolution, to switch between analog and digital correlated double sampling operation, etc. Moreover, the peripheral circuit can also be configured, based on the pixel array programming map, to only send the digital outputs from the subset of the pixel cells to the host processor. The subset of the pixel cells can be selected based on, for example, the subset of the pixel cells being more likely to provide relevant information to the application than the rest of the pixel cells. For example, for an object tracking application, the subset of the pixel cells can be determined as being more likely to include pixel data of an object being tracked. As another example, for a 3D sensing application, the subset of the pixel cells can be determined as being more likely to include pixel data of reflected structured light. In some examples, the host processor (or other processors) can identify one or more regions of interests (ROIs) based on the results of extraction of image features and/or patterns of reflected structure light from a prior image frame, and the pixel array programming map can be configured to signal the ROIs, such that a subset of pixel cells in the pixel cell array can be selected to generate pixel data based on the ROIs. The host processor (or other image processors) can determine the subset of pixels in the current image frame based on the pixels included in the regions of interests of the prior image frame and other parameters, such as the speed and direction of movement of the object with respect to the image sensor, the frame rate, etc., and signal the pixel cells corresponding to the subset of pixels in the pixel array programming map.

With the disclosed techniques, the image sensor can be configured such that only a subset of pixel cells generates pixel data, which can reduce the volume of pixel data transmitted to and processed by the host processor. Such arrangements allow the image sensor to provide high-resolution image data containing information that is most relevant to the application operated by the host processor at a frame rate, which can improve the performance of the application while relaxing the requirements of bandwidth and power. Such arrangements are especially beneficial to improving the performances of, for example, the aforementioned fusion of 2D and 3D sensing applications, object recognition and tracking applications, location tracking application, etc., operating on a relatively low power and low bandwidth platform, such as a wearable device.

In some examples, the signaling of ROIs using the pixel array programming map can be used to synchronize the transmission of structured light and the reception of the reflected light by the array of pixel cells to reduce the volume of pixel data generated by the image sensor. Specifically, an illuminator (or an array of illuminators) can be controlled to project structured light only to a region of a scene containing relevant information for an application (e.g., where an object being tracked is located). The illuminator can be controlled based on a pixel array programming map that defines the expected image location of the region of the scene as ROIs as well as the subsets of pixel cells to generate the pixel data. With such arrangements, the pixel data generated by the selected subset of pixel cells are more likely to contain information of interest to an application, which can further improve the performance of the application while reducing the volume of pixel data generated and transmitted by the image sensor.

Besides selectively enabling/disabling pixel data generation at the pixel cells, other techniques are proposed to further reduce the volume of data transmitted to and processed by the host processor. For example, the array of pixel cells can be configured by the programming map to implement a compressive sensing scheme, in which a master pixel cell within a selected group of pixel cells is configured to sum and quantize the analog outputs of the light measurement operations of all of the pixel cells within the group into a digital pixel value. The digital pixel value is transmitted to the host processor as the compressed output of the group of pixel cells. As another example, the image sensor can include a post processor to perform post-processing of the pixel data from the subset of pixel cells, and transmit the post-processed pixel data to the host processor. The post-processing can include various compression schemes to further reduce the volume of data transmitted to and processed by the host processor. For example, the post-processing can include a structured light pattern extraction scheme (e.g., a dot extraction scheme) to determine the pixel (or sub-pixel) locations of the reflected structured light patterns, and transmit only the pixel locations to the host processor. As another example, the post-processor can receive the pixel data from the array of pixel cells at a real frame rate, perform compression of the received pixel data, and transmit the compressed data at a reduced frame rate to the host processor. In these examples, the volume of data transmitted to and processed by the host processor can be substantially reduced, which can increase the achievable frame rate and resolution of image processing at the host processor within the power and bandwidth limits.

Besides data compression, the pixel array programming map can be used to configure the other aspects of the light measurement operations at the pixel cells. In some examples, the exposure time at each pixel cell can be individually configured by the pixel array programming map to support a calibration operation. For example, a subset of pixel cells can be configured to have zero exposure time to generate digital pixel data representing dark pixels. The pixel data generated by other pixel cells having non-zero exposure data can be adjusted based on the dark pixel data to account for the effects of temperature and/or other physical conditions that can affect the pixel data. As another example, each pixel cell be configured by the pixel array programming map to either perform measurement of light in the visible range (e.g., for 2D sensing), in the infra-red range (e.g., for 3D sensing), or both (to enable fusion of 2D and 3D sensing). All these can improve the operation flexibility of the image sensor to support more applications, which can improve user experience.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HIVID, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
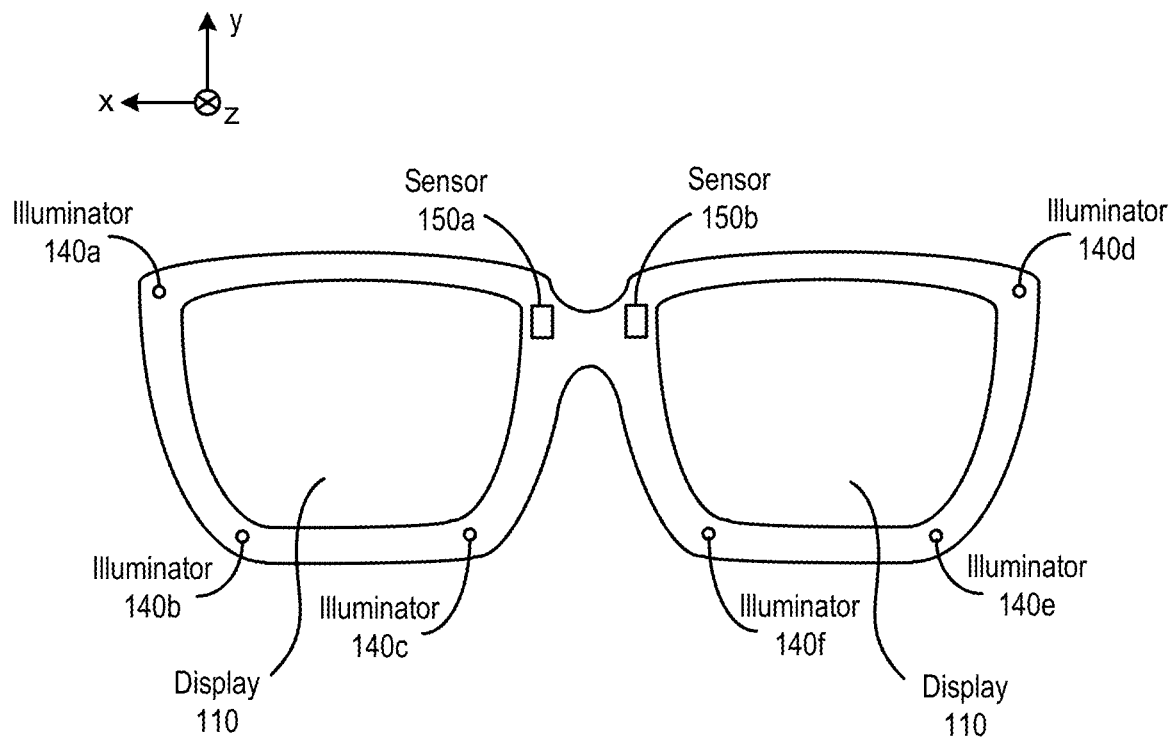
Figure 1B:
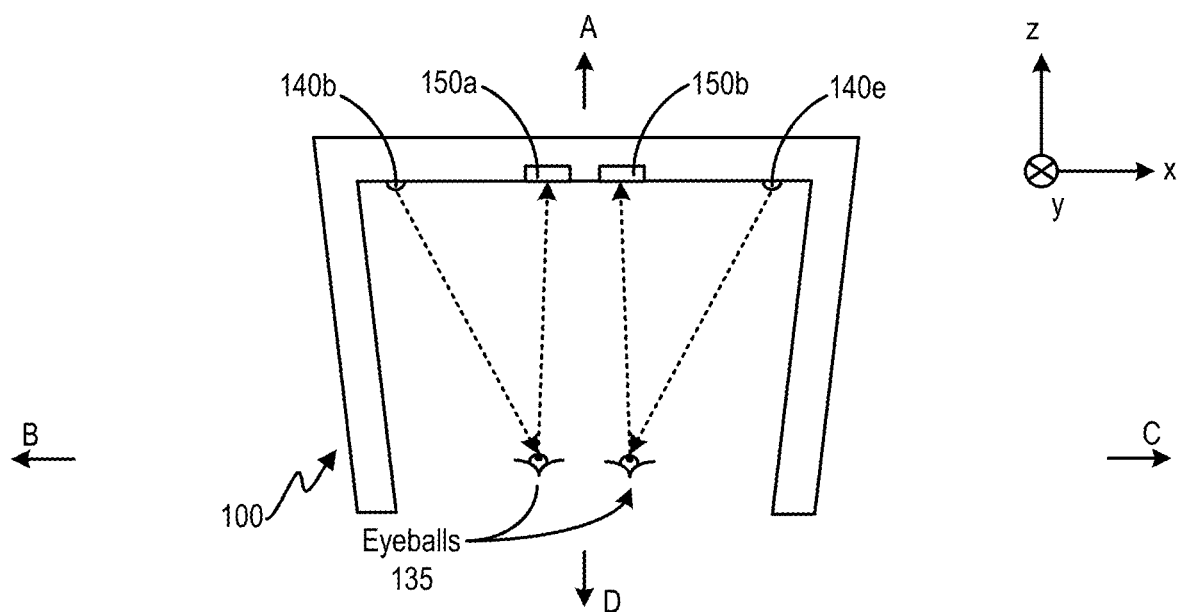

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
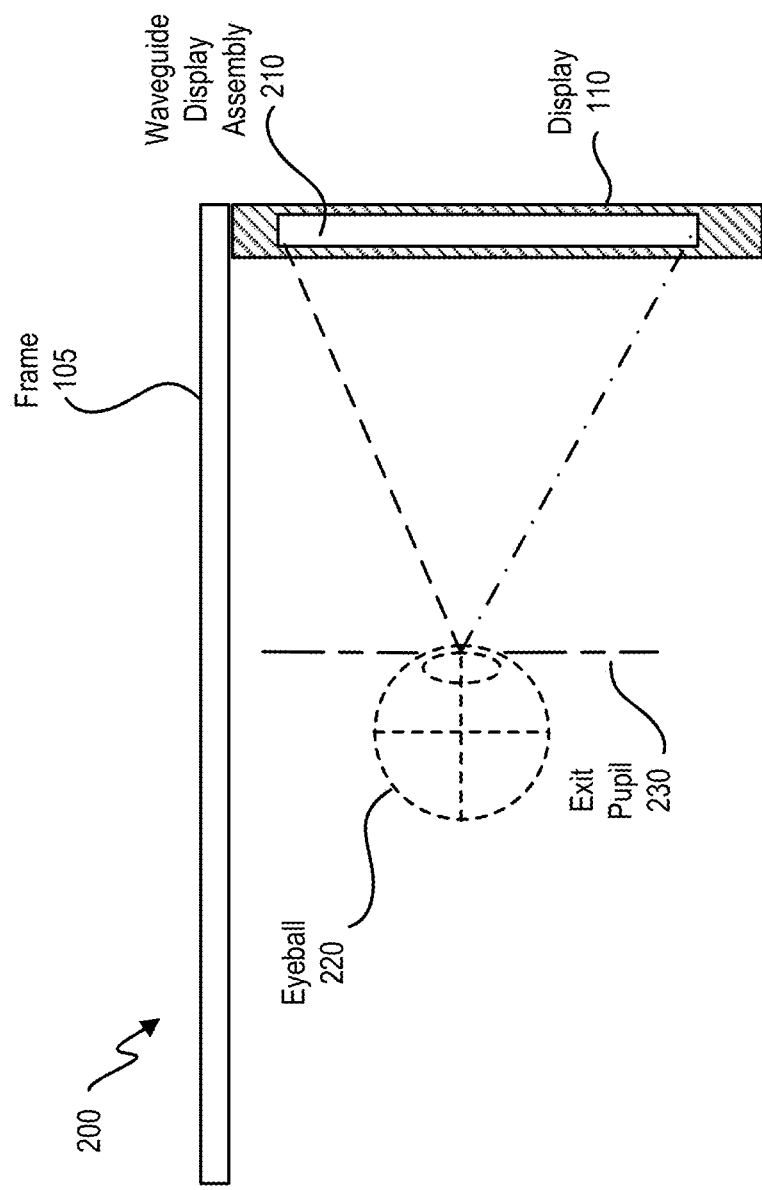
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
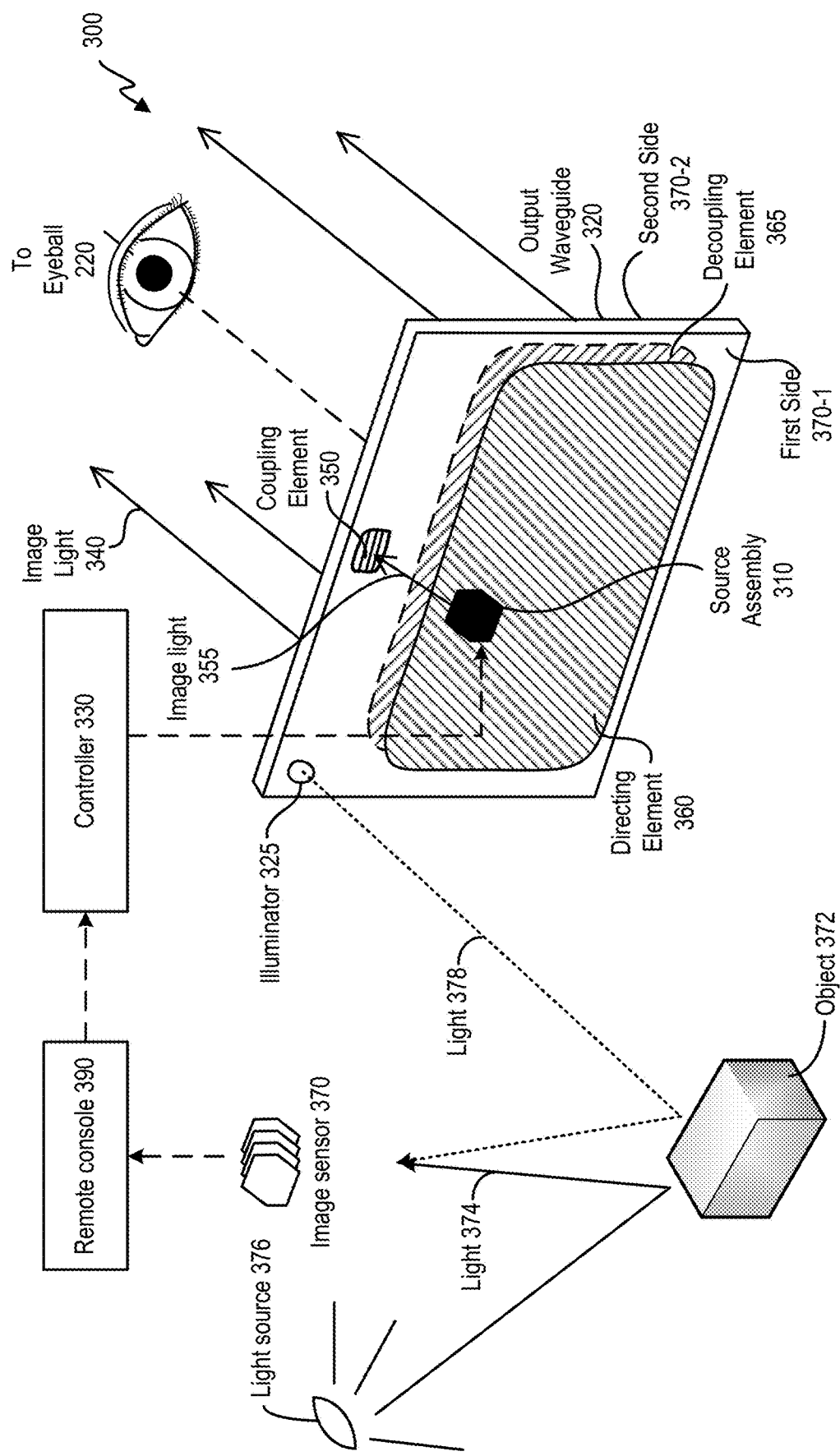
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
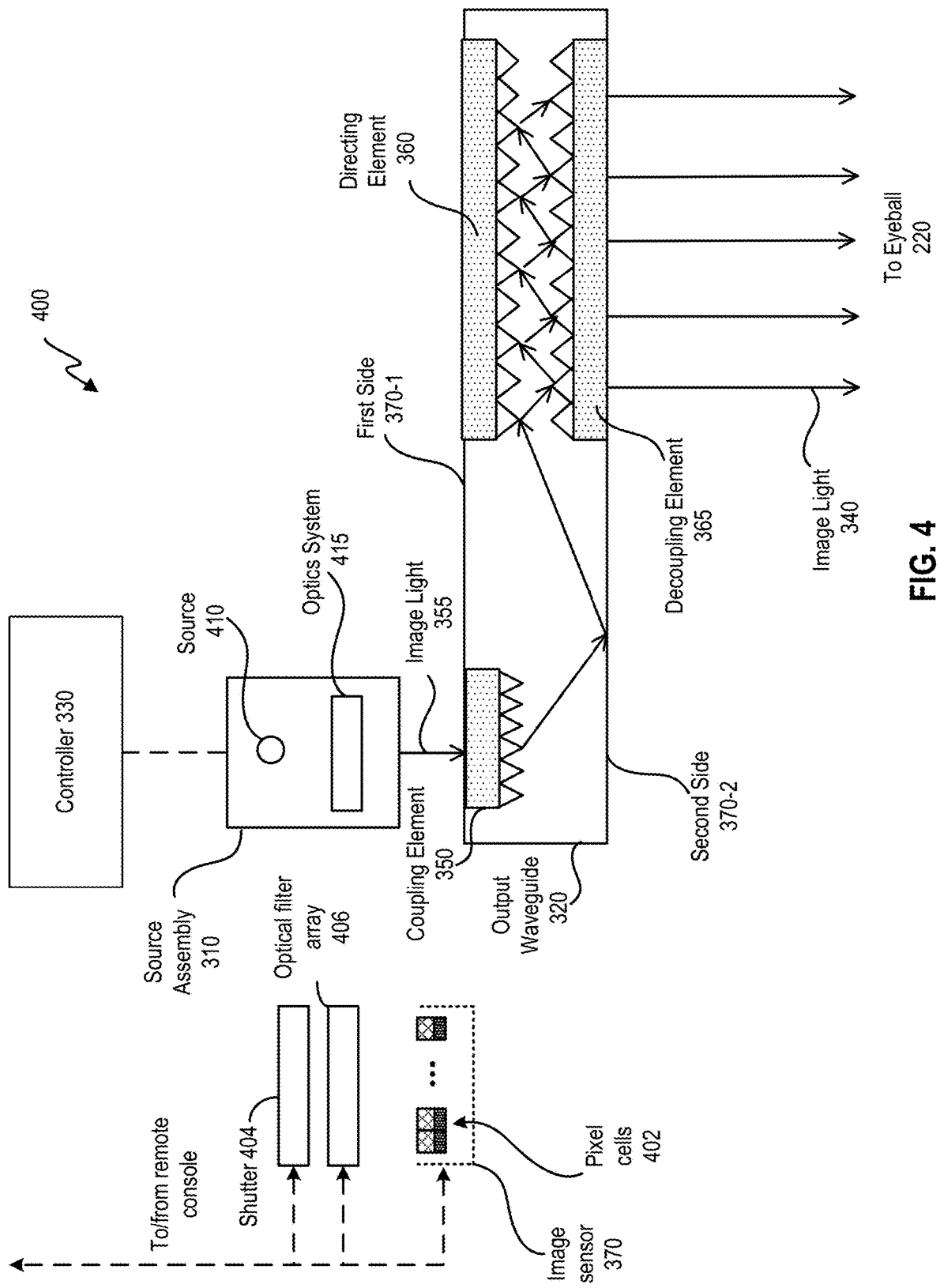
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is a diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
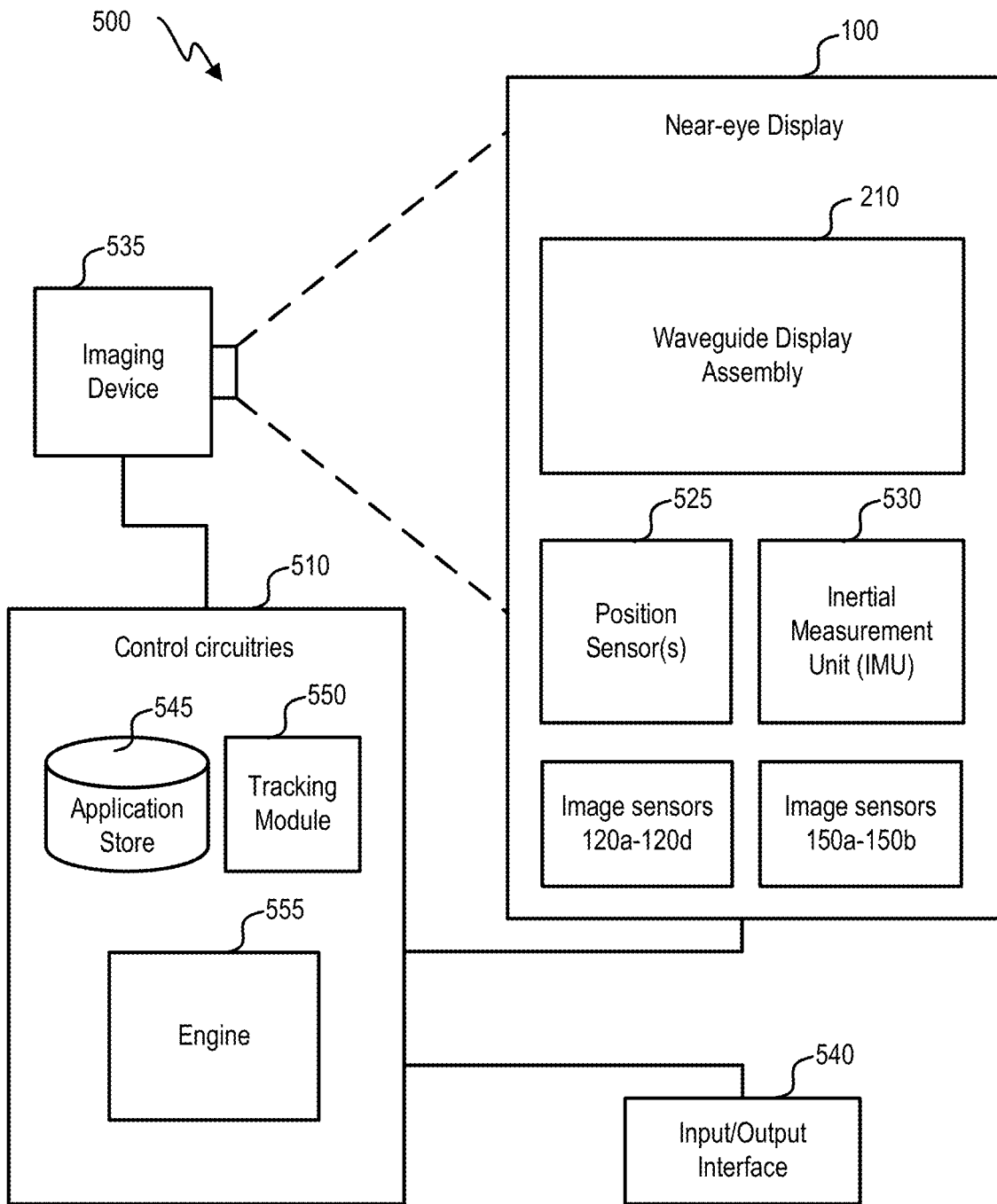
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
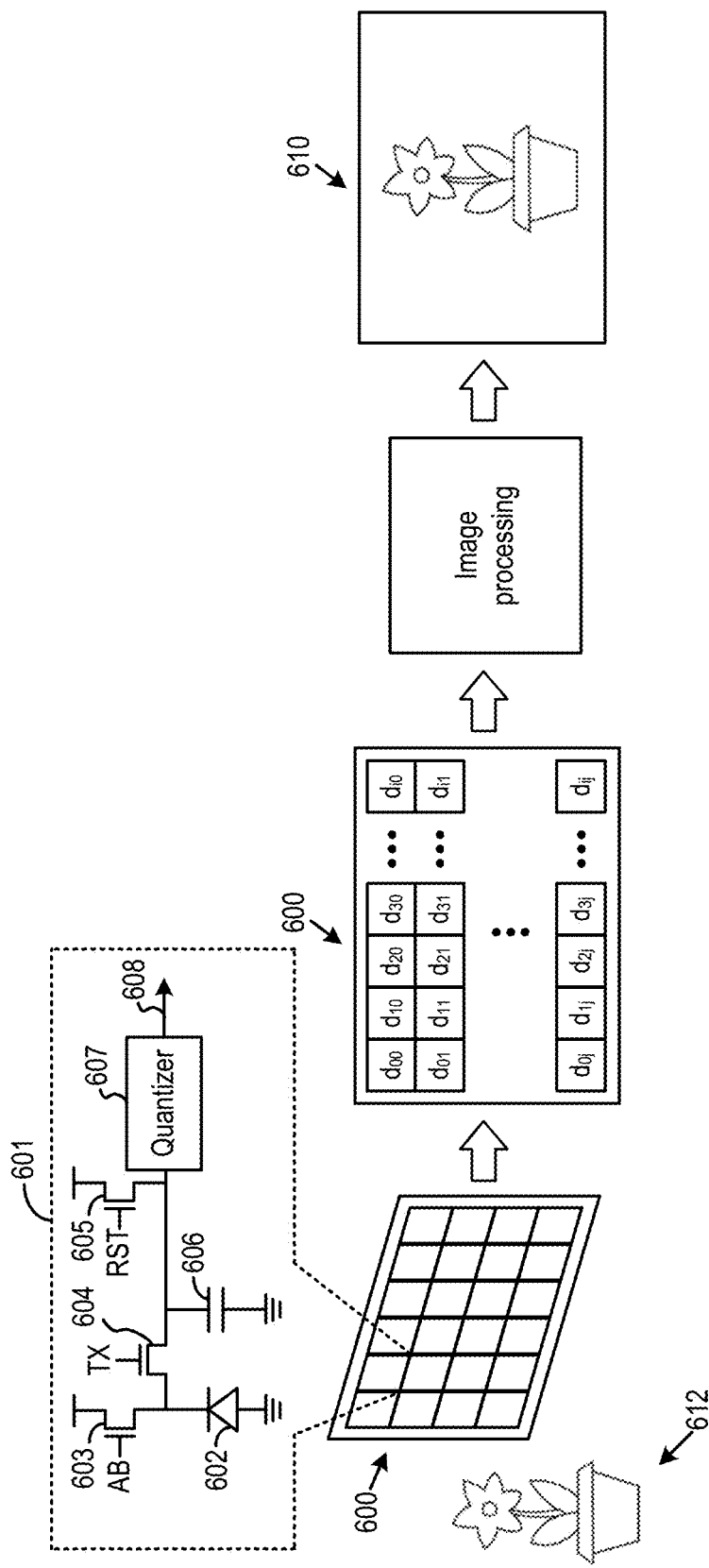
FIG. 6A, FIG. 6B, FIG. 6C, FIG. 6D, and FIG. 6E illustrate examples of an image sensor and its operations.
Figure 6B:
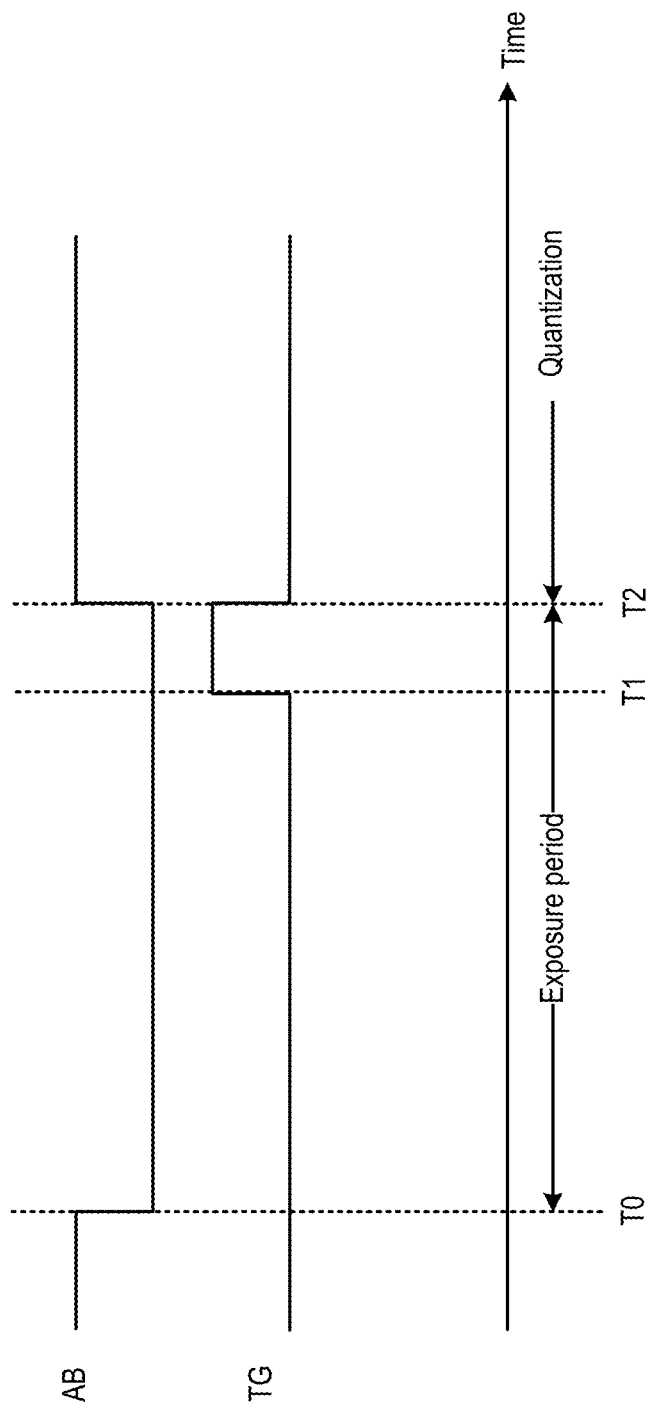

FIG. 6A, FIG. 6B, FIG. 6C, FIG. 6D, and FIG. 6E illustrate examples of an image sensor 600 and its operations. As shown in FIG. 6A, image sensor 600 can include an array of pixel cells, including pixel cell 601, and can generate digital intensity data corresponding to pixels of an image. Pixel cell 601 may be part of pixel cells 402 of FIG. 4. As shown in FIG. 6A, pixel cell 601 may include a photodiode 602, an electronic shutter gate 603, a transfer gate 604, a reset gate 605, a charge storage device 606, and a quantizer 607. Photodiode 602 may include, for example, a P-N diode, a P-I-N diode, a pinned diode, etc., whereas charge storage device 606 can be a floating drain node of transfer gate 604. Photodiode 602 can generate and accumulate charge upon receiving light within an exposure period, and the quantity of charge generated within the exposure period can be proportional to the intensity of the light. The exposure period can be defined based on the timing of AB signal controlling electronic shutter gate 603, which can steer the charge generated by photodiode 602 away when enabled, and based on the timing of the TX signal controlling transfer gate 604, which can transfer the charge generated by photodiode 602 to charge storage device 606 when enabled. For example, referring to FIG. 6B, the AB signal can be de-asserted at time T0 to allow photodiode 602 to generate charge and accumulate at least some of the charge as residual charge until photodiode 602 saturates. T0 can mark the start of the exposure period. The TX signal can set transfer gate 604 at a partially-on state to transfer additional charge (e.g., overflow charge) generated by photodiode 602 after saturation to charge storage device 606. At time T1, the TG signal can be asserted to transfer the residual charge to charge storage device 606, so that charge storage device 606 can store all of the charge generated by photodiode 602 since the beginning of the exposure period at time T0. At the time T2, the TX signal can be de-asserted to isolate charge storage device 606 from photodiode 602, whereas the AB signal can be asserted to steer charge generated by photodiode 602 away. The time T2 can mark the end of the exposure period. An analog voltage across charge storage device 606 at time T2 can represent the total quantity of charge stored in charge storage device 606, which can correspond to the total quantity of charge generated by photodiode 602 within the exposure period. Both TX and AB signals can be generated by a controller (not shown in FIG. 6A) which can be part of pixel cell 601. After the analog voltage is quantized, reset gate 605 can be enabled by an RST signal to remove the charge in charge storage device 606 to prepare for the next measurement.

Figure 6C:
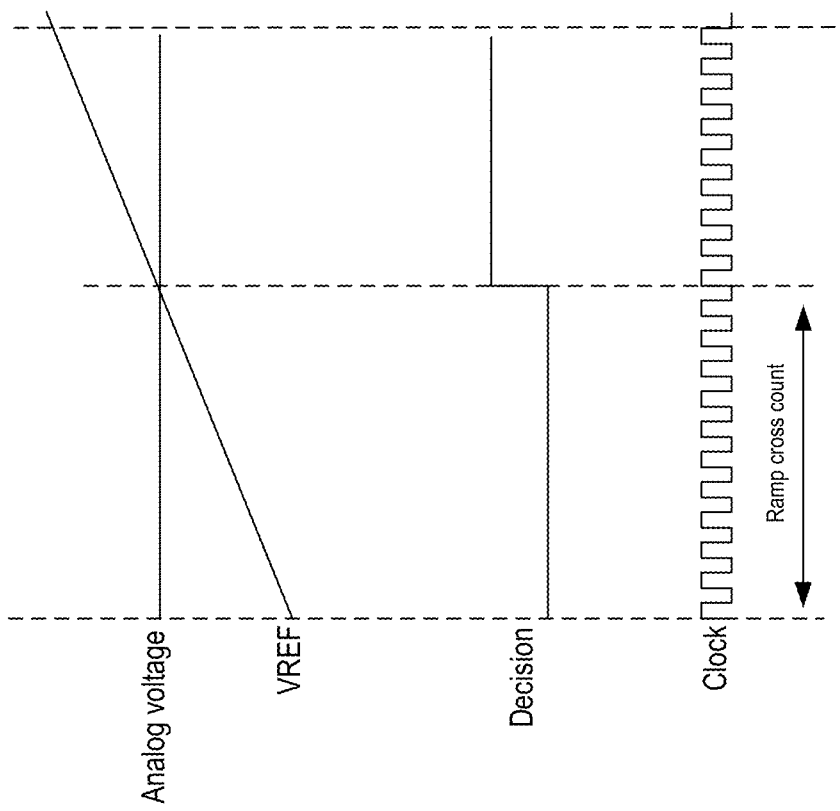
Figure 6D:
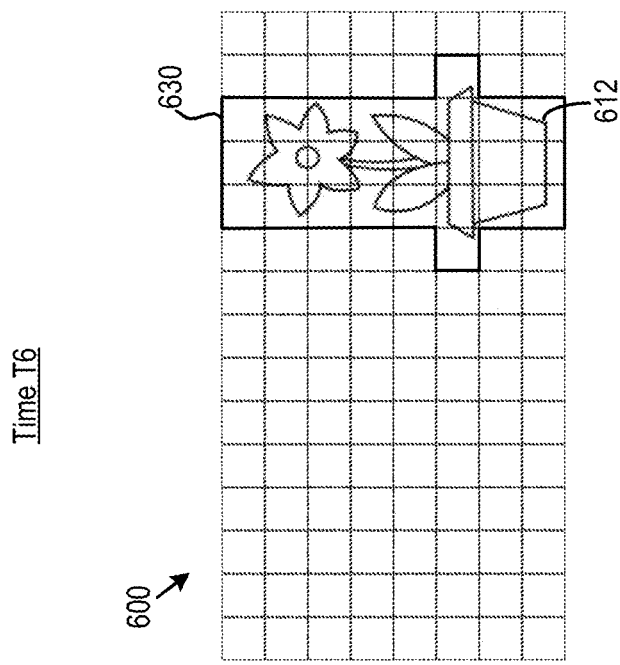
Figure 6D:
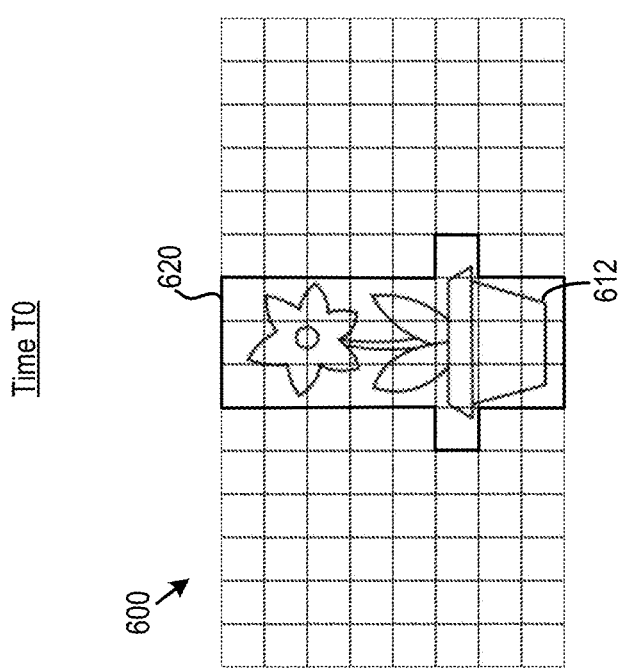
Figure 6E:
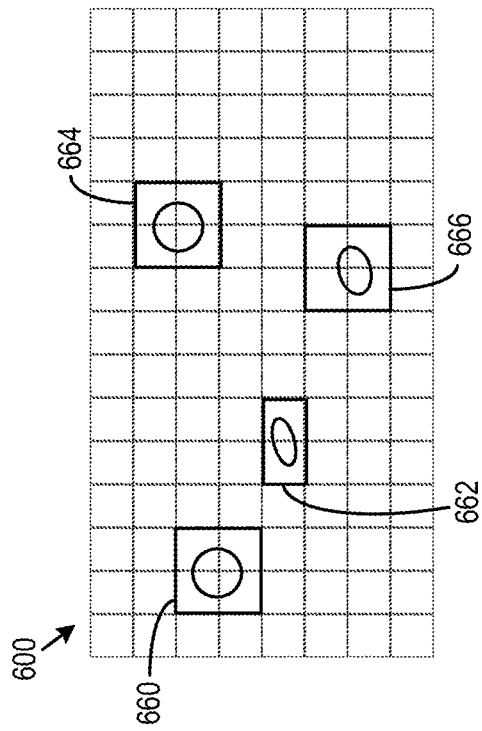
Figure 6E:
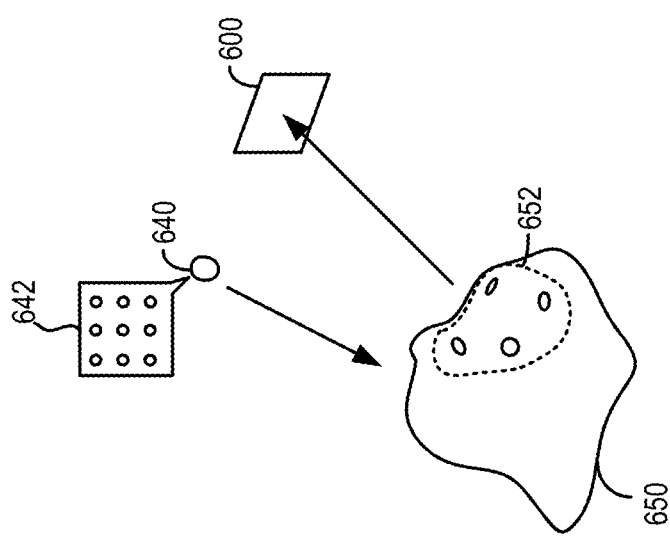

Quantizer 607 can be controlled by the controller to quantize the analog voltage after time T2 to generate a pixel value. FIG. 6C illustrates an example quantization operation performed by quantizer 607. As shown in FIG. 6C, quantizer 607 can compare (e.g., using a comparator) the analog voltage at charge storage device 606 with a ramping reference voltage (labelled "VREF" in FIG. 6C) to generate a comparison decision (labelled "Decision" in FIG. 6C). The time it takes for the decision to trip can be measured to represent a result of quantization of the analog voltage. In some examples, the time can be measured by a free-running counter that periodically updates its count value based on a clock signal (labelled "clock" in FIG. 6C), and the comparison decision from the comparator can control when the count value is stored in a memory. The frequency of the clock signal can set a resolution of the quantization operation. For example, a higher clock signal frequency can lead to a larger count range (with a higher bit depth) generated over the VREF range and a higher quantization resolution, whereas a lower clock signal frequency can lead to a smaller count range (with a lower bit depth) generated over the VREF range and a lower quantization resolution. An array of pixel data (e.g., $d_{00}$, $d_{01}$, etc.) can be output by image sensor 600. The array of pixel values can be further processed to generate an image 610 of an object 612.

The image data from image sensor 600 can be transmitted to host processor (not shown in FIG. 6A-FIG. 6E) to support different applications, such as identifying and tracking object 612, performing depth sensing of object 612 with respect to image sensor 600, etc. For all these applications, only a subset of pixel cells provide relevant information (e.g., pixel data of object 612), whereas the reset of pixel cells do not provide relevant information. For example, referring to FIG. 6D, at time T0 a group of pixel cells 620 of image sensor 600 receive light reflected by object 612, whereas time T6, object 612 may have shifted (e.g., due to a movement of object 612, a movement of image sensor 600, or both), and a group of pixel cells 630 of image sensor 600 receive light reflected by object 612. At both times T0 and T6, image sensor 600 can transmit only the pixel data from group of pixel cells 620 and 630 to the host processor to reduce the volume of pixel data being transmitted. Such arrangements can allow transmission of higher resolution images at a higher frame rate. For example, a larger pixel cell array including more pixel cells can be used to image object 612 to improve image resolution, while the bandwidth and power required to provide the improved image resolution can be reduced when only a subset of the pixel cells, including the pixel cells that provide pixel data of object 612, transmit the pixel data to the host processor. Similarly, image sensor 600 can be operated to generate images at a higher frame rate, but the increases in bandwidth and power can be reduced when each image only includes pixel values output by the subset of the pixel cells.

The volume of pixel data transmission can also be reduced in the case of 3D sensing. For example, referring to FIG. 6E, an illuminator 640 can project a pattern 642 of structured light onto an object 650. The structured light can be reflected on a surface of an object 650, and a pattern 652 of reflected light can be captured by image sensor 600 to generate an image. Host processor can match pattern 652 with pattern 642 and determine the depth of object 650 with respect to image sensor 600 based on the image locations of pattern 652 in the image. For 3D sensing, only groups of pixel cells 660, 662, 664, and 666 contain relevant information (e.g., pixel data of pattern 652). To reduce the volume of pixel data being transmitted, image sensor 600 can be configured to send only the pixel data from groups of pixel cells 660, 662, 664, and 666, or the image location locations of pattern 652 in the image, to the host processor.

FIG. 7A, FIG. 7B, FIG. 7C, FIG. 7D, and FIG. 7E illustrate examples of an image processing system 700 and its operations. Image processing system 700 includes a host device 702 and an image sensor 704. Host device 702 can include a host processor 706 which operates an application 708 which can perform operations including, for example, fusion of 2D and 3D sensing, object recognition and tracking, location tracking, etc. In some examples, image processing system 700 can be in a wearable device. In some examples, processing system 700 can be split into multiple separate devices. For example, host device 702 can be a personal computer (PC), a smart phone, a camera base station, or an integrated circuit such as a central processing unit (CPU), a field-programmable gate array (FPGA), a micro controller unit (MCU), etc. Host device 702 and image sensor 704 can be electrically connected via an interconnect (not shown in FIG. 7A), such as an interconnect compatible with the Mobile Industry Processor Interface (MIPI) standard.

Figure 7A:
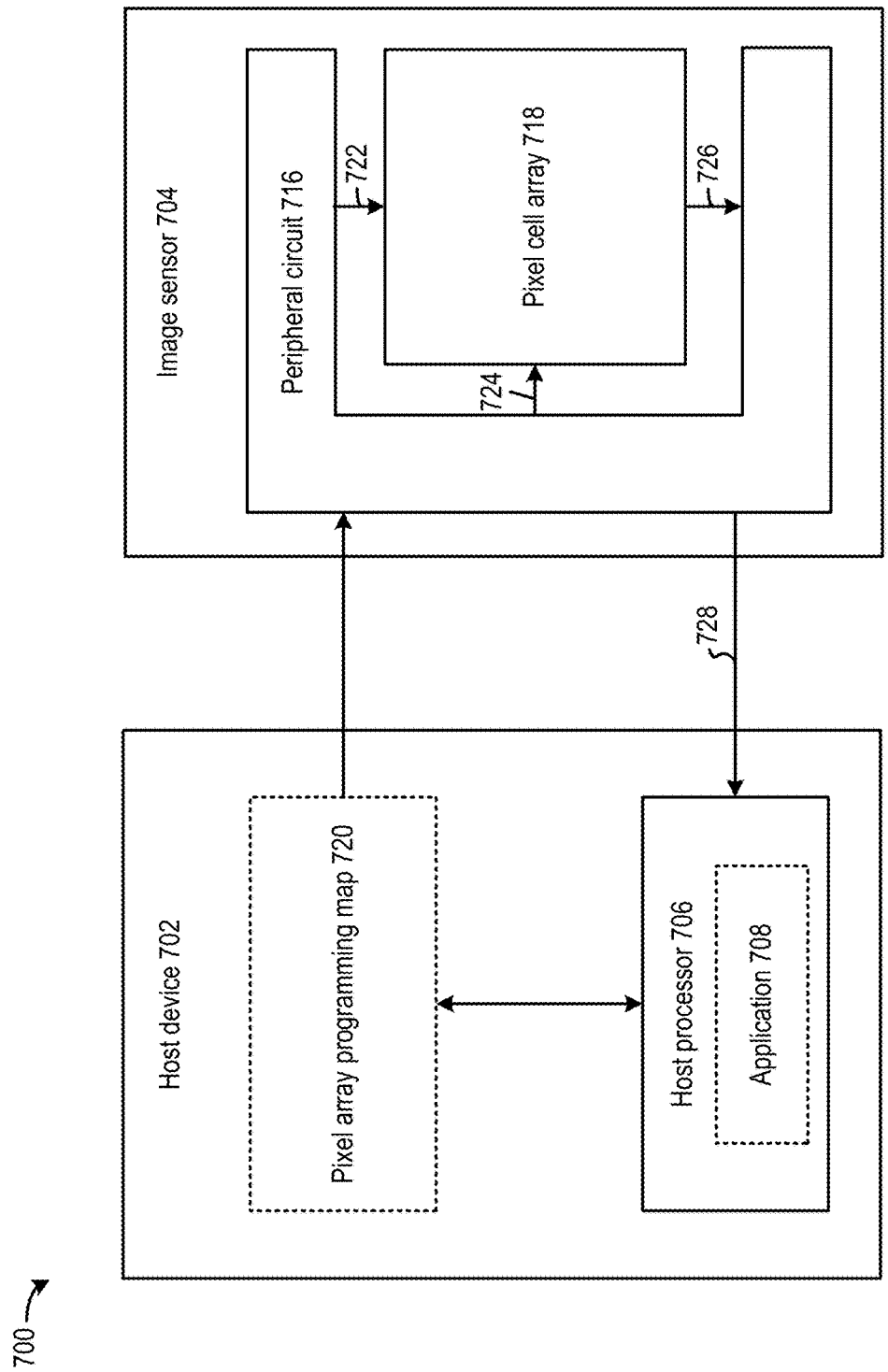
FIG. 7A, FIG. 7B, and FIG. 7C illustrate an example of an image processing system and its operations.

Referring to FIG. 7A, image sensor 704 includes a peripheral circuit 716 and a pixel cell array 718. Each pixel cell of pixel cell array 718 can include similar components as pixel cell 601 of FIG. 6A such as photodiode 602, electronic shutter gate 603, transfer gate 604, charge storage device 606, and quantizer 607, to perform a light measurement operation to generate pixel data. Each pixel cell in pixel cell array 718 may include a configuration memory, which can be part of or external to the pixel cell, to store programming data for configuring/programming the light measurement operation at the each pixel cell. The configuration memory of each pixel cell can be individually addressable, which allows the light measurement operation at each pixel cell to be individually programmed by peripheral circuit 716 based on a pixel array programming map 720 provided by host device 702. Programming data can be read out from the configuration memory to configure the light measurement operation. As to be described in details below, the configuration of the light measurement operation at a pixel cell can include, for example, enabling or disabling the generation of pixel data from the light measurement operation, setting an exposure period for the light measurement operation, operating a pixel cell in a dark mode to generate pixel data representing a dark pixel, setting a quantization resolution/bit depth, setting a wavelength range of light being measured, performing data compression, setting a mode of correlated double sampling, etc. In some examples, pixel cell array 718 and peripheral circuit 716 can form a stack structure to maximize the light receiving surface of image sensor 704, which allows pixel cell array 718 to include more pixel cells to improve resolution.

Figure 7B:
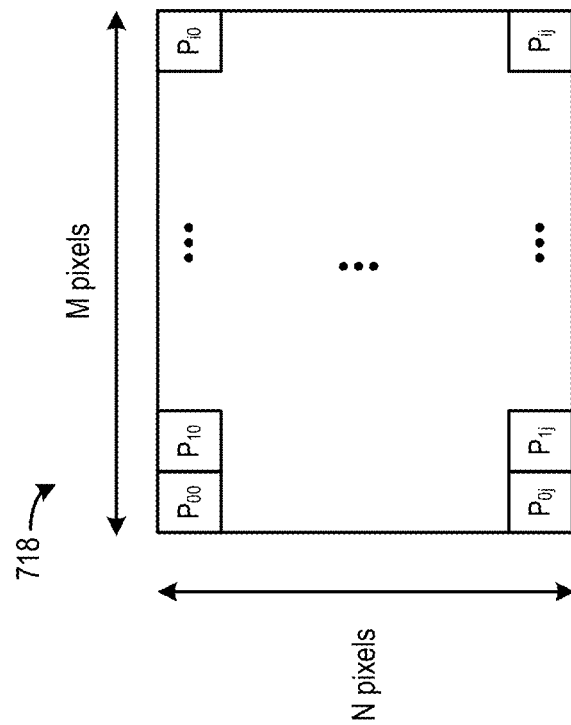
Figure 7B:
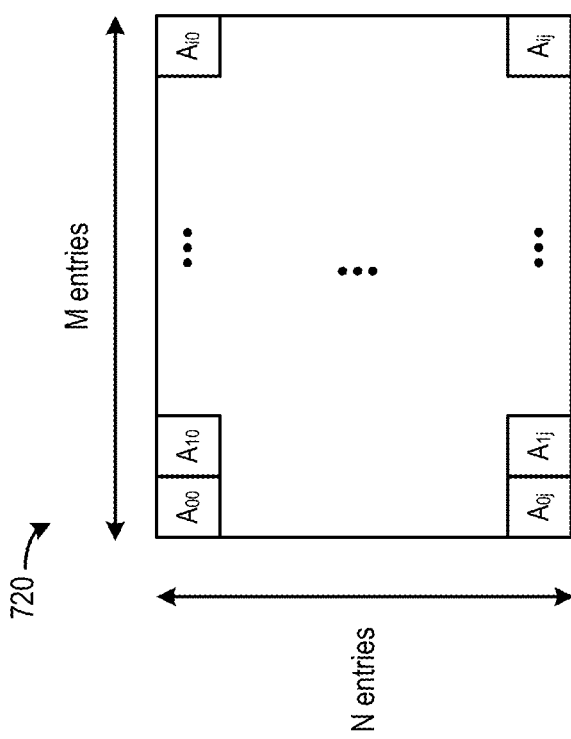

Pixel array programming map 720 can include programming data targeted at each pixel cell of the array of pixel cells. FIG. 7B illustrates an example of pixel array programming map 720. As shown in FIG. 7B, pixel array programming map 720 can be include a two-dimensional array of programming data, with each entry of programming data of the two-dimensional array targeted at a pixel cell of pixel cell array 718. For example, in a case where pixel cell array 718 has a width of M pixels (e.g., M columns of pixels) and a height of N pixels (e.g., N rows of pixels), pixel array programming map 720 also has a width of M entries (e.g., M columns of entries) and a height of N entries (e.g., N rows of entries). The programming data $A_{00}$ at entry (0, 0) of pixel array programming map 720 is targeted at pixel cell $P_{00}$ at pixel location (0, 0) of pixel cell array 718, whereas the programming data $A_{01}$ at entry (0, 1) of pixel array programming map 720 is targeted at pixel cell $P_{01}$ at pixel location (0, 1) of pixel cell array 718. In some examples, the programming data of each entry of pixel array programming map 720 can be transmitted sequentially following a predetermined scanning pattern, such as traversing a row from left to right (e.g., $A_{00}, A_{01}, \ldots A_{0i}$), followed by the next row from left to right (e.g., $A_{10}, A_{11}, \ldots A_{1i}$), to form a stream of serial data. The programming data for each entry can be extracted and identified from the stream of serial data based on the scanning pattern and the order by which the entries are received. In some examples, pixel array programming map 720 can be sent only when certain programming data need to be updated between frames, and only the programming data that need to be updated are included in pixel array programming map 720.

Figure 7C:
Figure 7C:
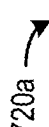

Depending on the configuration operation, each entry of pixel array programming map 720 can either include binary programming data or non-binary programming data. FIG. 7C illustrates examples of pixel array programming maps 720a and 720b. As shown in FIG. 7C, pixel array programming map 720a includes binary programming data 0 and 1. In some examples, the binary programming data at each entry of pixel array programming map 720a can enable (e.g., with programming data set to 1) or disable (e.g., with programming data set to 0) the generation of pixel data at the pixel cell corresponding to the entry. The binary programming data at each entry of pixel array programming map 720a can also configure the pixel cell corresponding to the entry to operate in a dark mode (e.g., with programming data set to 0) to generate dark pixel data, or to operate in a normal mode (e.g., with programming data set to 1). A pixel cell can be operated in the dark mode based on, for example, keeping the charge storage device in a reset state, setting the exposure period to have a zero duration, etc. In addition, pixel array programming map 720b may include non-binary programming data such as −1, 0, and 1. The non-binary programming data of pixel array programming map 720b, as shown in FIG. 7C, can be used to choose a configuration out of three candidate configurations. For example, a pixel cell can be configured to perform light measurement operation in the visible light wavelength range (e.g., with programming data set to 1), in the infra light wavelength range (e.g., with programming data set to −1), or no measurement (e.g., with programming data set to 0). The non-binary programming data of pixel array programming map 720b can also take on other values to set, for example, the duration of the exposure period, a quantization resolution/bit depth etc.

In some examples, pixel array programming map 720a/b can be generated by the application (e.g., application 708) operating at host device 702 that consumes the pixel data from pixel cell array 718. For example, application 708 may identify, from an image, pixels that contain relevant information, and determine a region of interest (ROI) comprising the pixels. Pixel cells that generate pixel data corresponding to the ROI can then be identified. As an illustrative example, referring back to the example of FIG. 6D, application 708 may identify an ROI including the group of pixel cells 620 as providing relevant information (e.g., pixel data of object 612) in an image at time T0. Application 708 can then predict the change in the ROI between times T0 and T6 based on, for example, a direction and a speed of movement of object 612 with respect to image sensor 600. Application 708 can then predict the new image location of the ROI at time T6, which includes the group of pixel cells 630, based on the image location of the group of pixel cells 620 at time T0 and the predicted change. Based on the image location of the group of pixel cells 630 at time T6, application 708 can generate pixel array programming map 720a by setting the programming data of the entries corresponding to the group of pixel cells 630 to one, while setting the programming data of the rest of the entries to zero, so that only the group of pixel cells 630 transmits pixel data to host device 702. In some examples, the ROIs can also be used to set a non-uniform spatial sampling rate such that each pixel cell corresponding to the ROIs transmits pixel data, whereas outside the ROI, a sparsely distributed set of pixel cells is selected to transmit pixel data. The selection of which pixel cells to transmit pixel data can be encoded in pixel array programming map 720a.

In some examples, application 708 may maintain a model of an environment in which an object being tracked is located based on prior images, and predict the pixel cells that are likely to provide the pixel data of the object in a current image based on an environment model. In some examples, image sensor 704, or other processing circuit that is part of the same chip as image sensor 704, may also compute fixed primitives (e.g. temporal or spatial contrast) and estimate where relevant information is occurring based on those primitives, and generate pixel array programming map 720a based on the estimation.

Figure 8A:
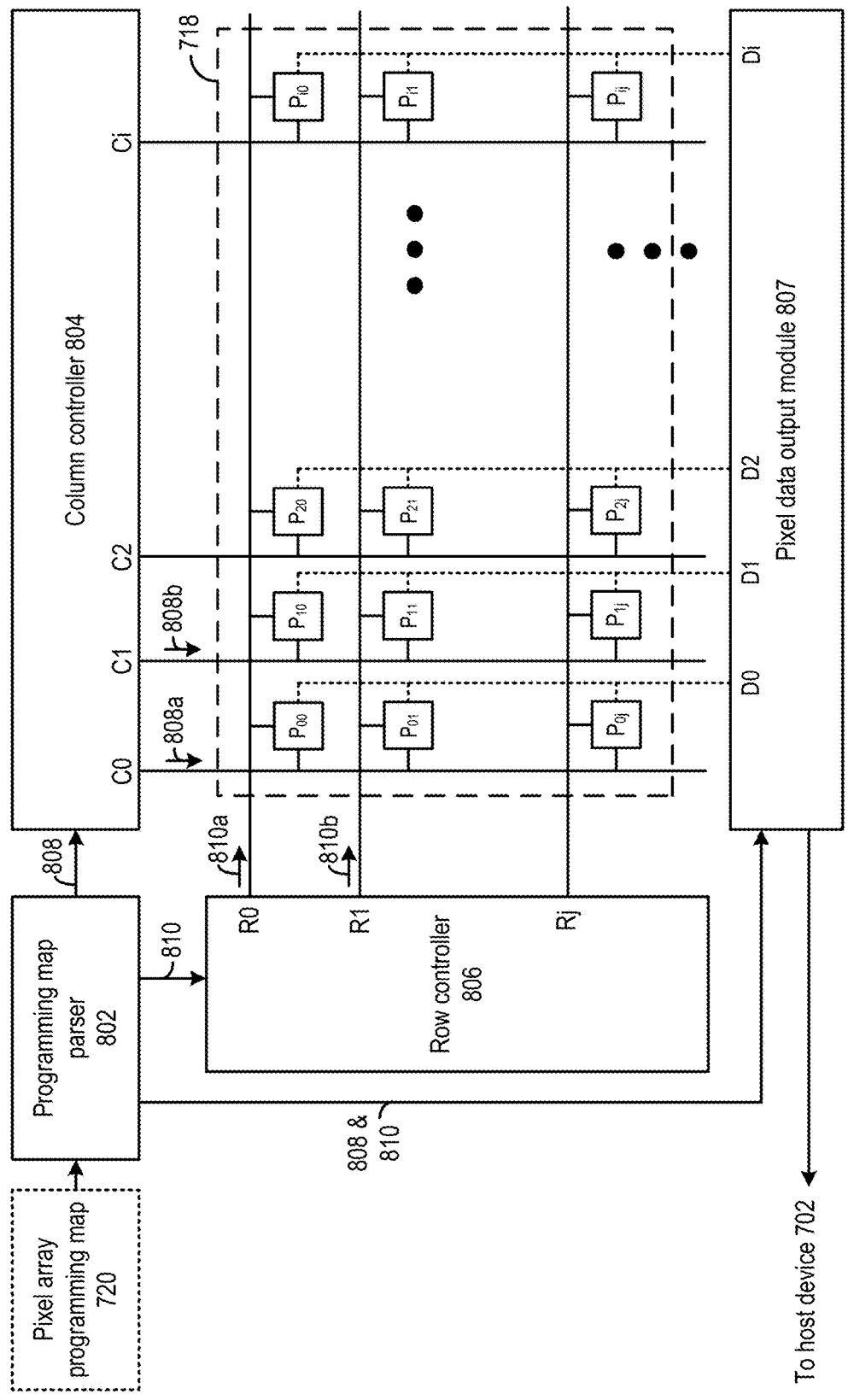
FIG. 8A and FIG. 8B illustrate example components of the image processing system of FIGS. 7A-7C.
Figure 8B:
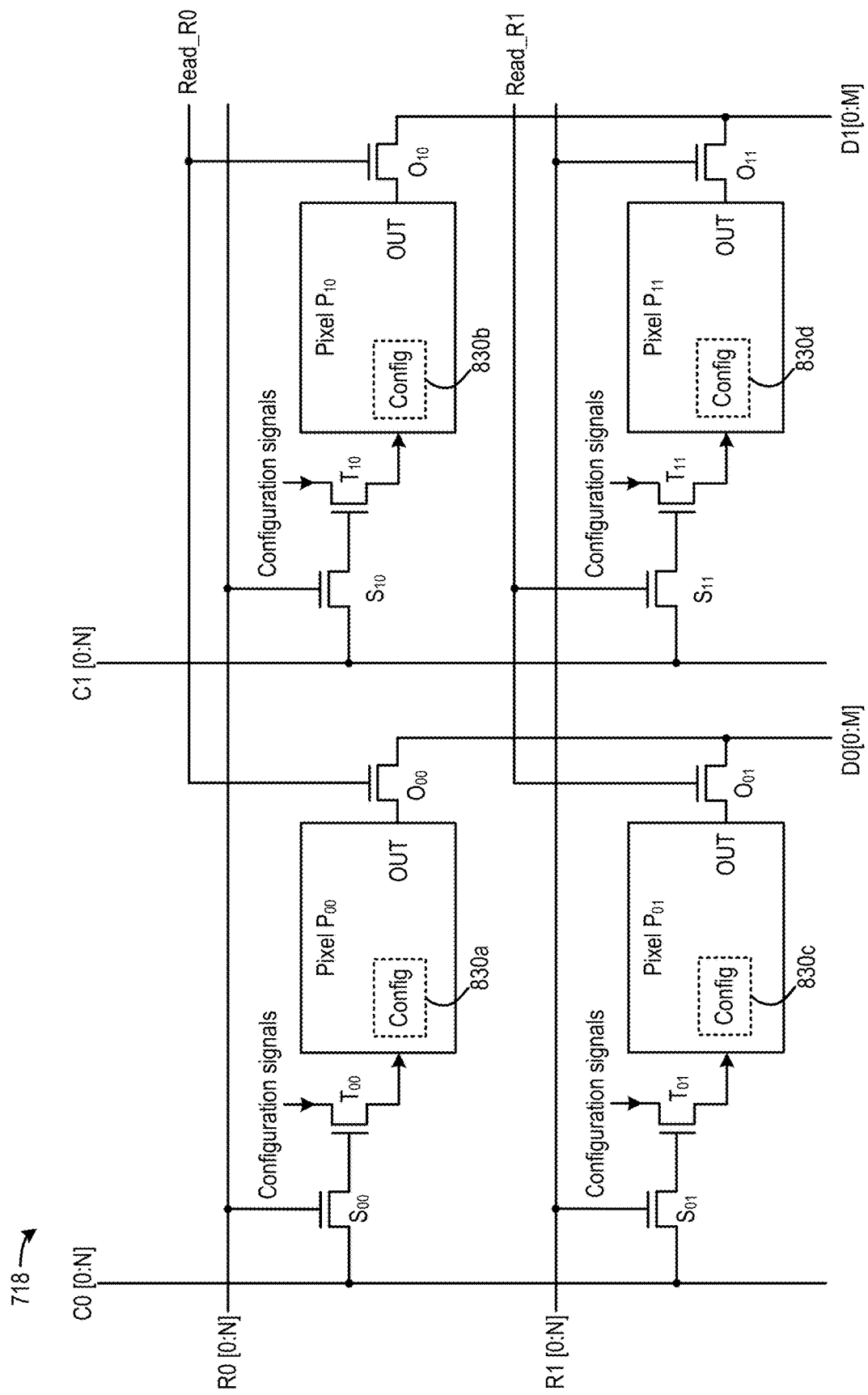

FIG. 8A and FIG. 8B illustrate example components of peripheral circuit 716 and pixel cell array 718. As shown in FIG. 8A, peripheral circuit 716 can include a programming map parser 802, a column controller 804, a row controller 806, and a pixel data output module 807. Programming map parser 802 can parse pixel array programming map 720, which can be in a serial data stream, to identify the programming data for each pixel cell. The identification of the programming data can be based on, for example, a predetermined scanning pattern by which the two-dimensional pixel array programming map is converted into the serial format, as well as the order by which the programming data is received by programming map parser 802 from the serial data stream. Programming map parser 802 can create a mapping among the row addresses of the pixel cells, the column addresses of the pixel cells, and one or more configuration signals based on the programming data targeted at the pixel cells. Based on the mapping, programming map parser 802 can transmit control signals 808 including the column addresses and the configuration signals to column controller 804, as well as control signals 810 including the row addresses mapped to the column addresses and the configuration signals to row controller 806. In some examples, the configuration signals can also be split between control signals 808 and control signals 810, or sent as part of control signals 810 to row controller 806.

Column controller 804 and row controller 806 are configured to forward the configuration signals received from programming map parser 802 to the configuration memory of each pixel cell of pixel cell array 718. As shown in FIG. 8A, column controller 804 drives a plurality of sets of column buses C0, C1, . . . Ci. Each set of column buses includes one or more buses and can be used to transmit control signals 722 of FIG. 7A, which can include a column selection signal and/or other configuration signals, to a column of pixel cells. For example, column bus(es) C0 can transmit a column selection signal 808a to select a column of pixel cells $p_{00}$, $p_{01}$, . . . $p_{0j}$, column bus(es) C1 can transmit a column selection signal 808b to select a column of pixel cell $p_{10}$, $p_{11}$, $p_{1j}$, etc. Further, row controller 806 drives a plurality of sets of row buses labelled R0, R1, . . . Rj. Each set of row buses also includes one or more buses and can be used to transmit control signals 724 of FIG. 7A, which can include a row selection signal and/or other configuration signals, to a row of pixel cells. For example, row bus(es) R0 can transmit a row selection signal 810a to select a row of pixel cells $p_{00}$, $p_{10}$, $p_{10}$, row bus(es) R1 can transmit a row selection signal 810b to select a row of pixel cell $p_{01}$, $p_{11}$, $p_{1j}$, etc. Any pixel cell within pixel cell array 718 can be selected based on a combination of the row selection signal and the column signal to receive the configuration signals. The row selection signals, column selection signals, and the configuration signals (if any) are synchronized based on control signals 808 and 810 from programming map parser 802, as described above. Each column of pixel cells can share a set of output buses to transmit pixel data to pixel data output module 807. For example, column of pixel cells $p_{00}$, $p_{01}$, . . . $p_{0j}$ can share output buses $D_0$, column of pixel cells $p_{10}$, $p_{11}$, $p_{1j}$ can share output buses $D_1$, etc.

Pixel data output module 807 can receive the pixel data from the buses, convert the pixel data into one or more serial data streams (e.g., using a shift register), and transmit the data streams to host device 702 under a pre-determined protocol such as MIPI. In addition, pixel data output module 807 can also receive control signals 808 and 810 from programming map parser 802 to determine, for example, which pixel cell does not output pixel data, the bit width of pixel data output by each pixel cell, etc., and then adjust the generation of serial data streams accordingly. For example, pixel data output module 807 can control the shift register to skip a number of bits in generating the serial data streams to account for, for example, variable bit widths of output pixel data among the pixel cells, the disabling of pixel data output at certain pixel cells, etc.

FIG. 8B illustrates additional details of pixel cell array 718, including configuration memory 830 (e.g., 830a, 830b, 830c, and 830d) of each pixel cell. Although FIG. 8B shows that configuration memory 830 are internal to each pixel cell, it is understood that configuration memory 830 can also be external to each pixel cell. As shown in FIG. 8B, the configuration memory 830 of each pixel cell is coupled with column buses C and row buses R via transistors S, such as $S_{00}$, $S_{10}$, $S_{10}$, $S_{11}$, etc. In some examples, each set of column buses (e.g., C0, C1, etc.) and row buses (e.g., R0, R1, etc.) can include multiple bits. For example, in FIG. 8B, each set of column buses and row buses can carry N+1 bits. It is understood that in some examples each set of column buses and row buses can also carry a single data bit. Each pixel cell is also electrically connected with transistors T, such as $T_{00}$, $T_{10}$, $T_{10}$, $T_{11}$, etc., to control the transmission of configuration signals to the pixel cell. Transistor(s) S of each pixel cell can be driven by the row and column select signals to enable (or disable) the corresponding transistors T to transmit configuration signals to the pixel cell. In some examples, column controller 804 and row controller 806 can be programmed by a single write instruction (e.g., from host device 702) to write to configuration memory 830 of multiple pixel cells simultaneously. Column controller 804 and row controller 806 can then control the row buses and column buses to write to the configuration memory of the pixel cells.

In the example shown in FIG. 8B, configuration memory 830 of each pixel cell can be implemented as a dynamic random access memory (DRAM), but in some examples, additional row/column buses can be included in pixel cell array 718 to enable configuration memory 830 of each pixel cell to be implemented as static random access memory (SRAM).

In addition, each pixel cell also includes transistors O, such as $O_{00}$, $O_{10}$, $O_{10}$, $O_{11}$, etc., to control the sharing of the output bus D among a column of pixel cells. The transistors O of each row can be controlled by a read signal (e.g., read_R0, read_R1, etc.) to enable a row-by-row read out of the pixel data, such that one row of pixel cells output pixel data through output buses D0, D1, . . . Di, followed by the next row of pixel cells.

In cases where the programming is based on binary data (e.g., to enable/disable generation of pixel data at a pixel cell, to operate a pixel cell in dark mode, etc.), the column and row selection signals can be based on the binary programming data in pixel array programming map 720, and the configuration signals can come from a fixed source rather than from the row/column buses. For example, to enable the generation of pixel data at a pixel cell, the row and column selection signal for that pixel cell can be asserted, and configuration signals can come from a power source, to enable transistor T of that pixel cell to transmit a logical one to configuration memory 830 of that pixel cell to enable the pixel data generation. To disable the generation of pixel data at the pixel cell, the row and column selection signal for that pixel cell can be de-asserted to prevent transistor T of the pixel cell from transmitting a logical one to configuration memory 830 of that pixel cell. In cases where the programming is based on non-binary data (e.g., to set an exposure period duration, a quantization resolution/bit depth, etc.), the column and/or row buses can also carry the configuration data (e.g., a digital value to set the exposure period, a clock signal to set the quantization/bit depth), etc. The configuration memory of multiple pixel cells can be written simultaneously, as described above.

FIG. 9A, FIG. 9B, FIG. 9C, FIG. 9D, FIG. 9E, and FIG. 9F illustrate different examples of a programmable pixel cell. It is understood that the programmable features illustrated in each of the figures can be combined into a single pixel cell.

Figure 9A:
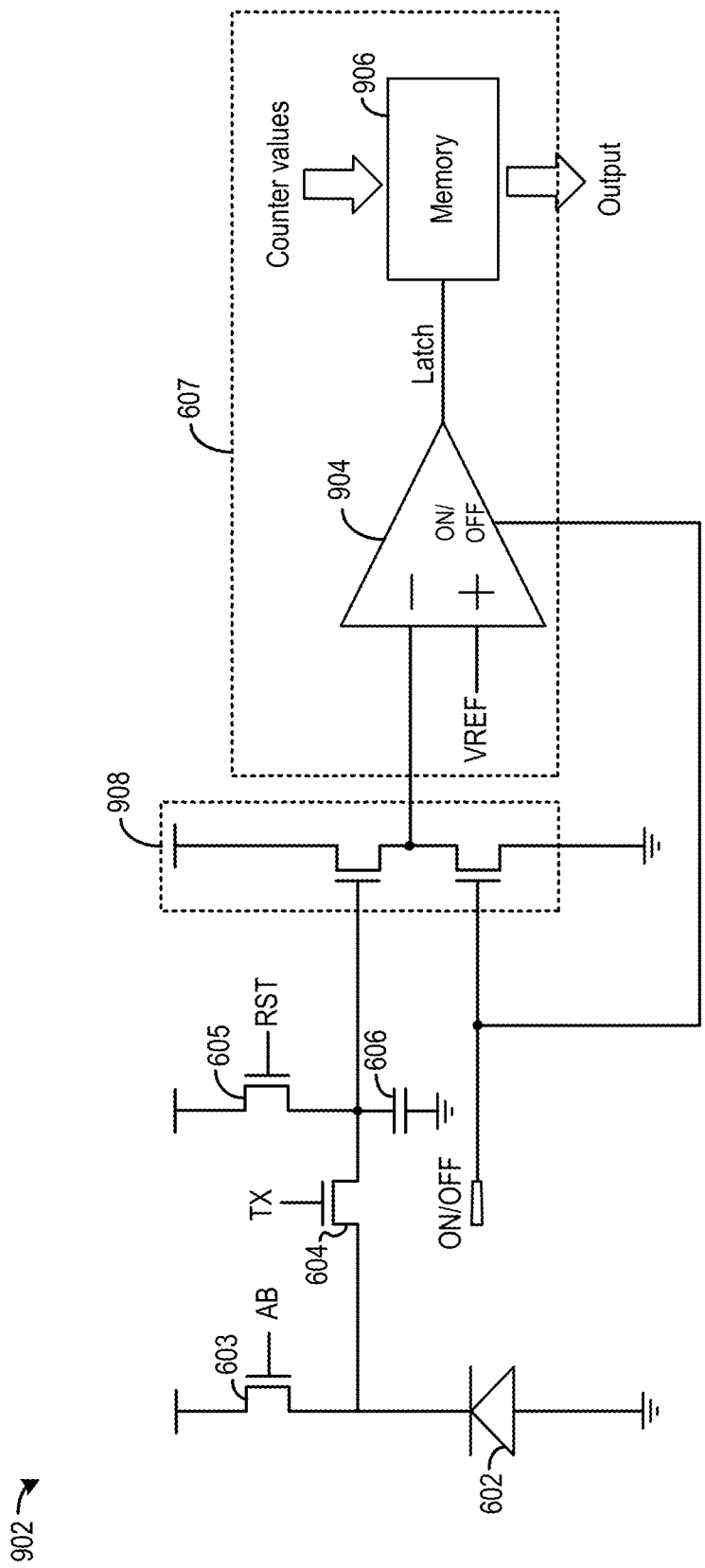
FIG. 9A, FIG. 9B, FIG. 9C, FIG. 9D, FIG. 9E, and FIG. 9F illustrate example components of the image processing system of FIGS. 7A-7C.

FIG. 9A illustrates an example of pixel cell 902 of which the generation of pixel data can be enabled/disabled. Referring to FIG. 9A, a pixel cell 902 can include a photodiode 602, electronic shutter gate 603, transfer gate 604, charge storage device 606, and quantizer 607 including a comparator 904 and a memory 906. Pixel cell 902 further includes reset gate 605 which can be controlled to reset charge storage device 606 before the exposure period starts. Memory 906 can receive counter values from a free running counter which can be internal or external to pixel cell 902. Pixel cell 902 further includes a voltage buffer 908 to buffer the analog voltage at charge storage device 606. Comparator 904 can compare the buffered voltage with a ramping VREF to generate a latch signal to store the counter value from the counter into memory 906. As described above with respect to FIG. 6C, the timing of the latch signal determines the counter value stored into memory 906, and the stored counter value can be output as pixel data to represent a result of quantization of the buffered analog voltage.

As shown in FIG. 9A, voltage buffer 908 and comparator 904 can be turned on/off by an ON/OFF signal, which can be stored in the configuration memory based on the row selection and column selection signals on the row bus and column bus, as described in FIG. 8B. The row and column selection signals can be generated based on pixel array programming maps 720a of FIG. 7C. The ON/OFF signal can then be read out from the configuration memory. When comparator 904 and voltage buffer 908 are disabled, no latch signal is generated. Memory 906 does not store a counter value, and the outputting of pixel data can be disabled. In some examples (not shown in FIG. 9A), memory 906 can also be power gated by the ON/OFF signal. Meanwhile, pixel data output module 807 can also be configured based on control signals from programming map parser 802 to skip the read out of the pixel data output of that pixel cell. With such arrangements, substantial power saving can be achieved at the pixel cell by disabling the voltage buffer and the comparator, which typically uses the most power among the components of the pixel cell. Moreover, the volume of pixel data transmitted to the host device can also be reduced, which can further reduce the power consumption at the interconnect and at the host device.

Figure 9B:
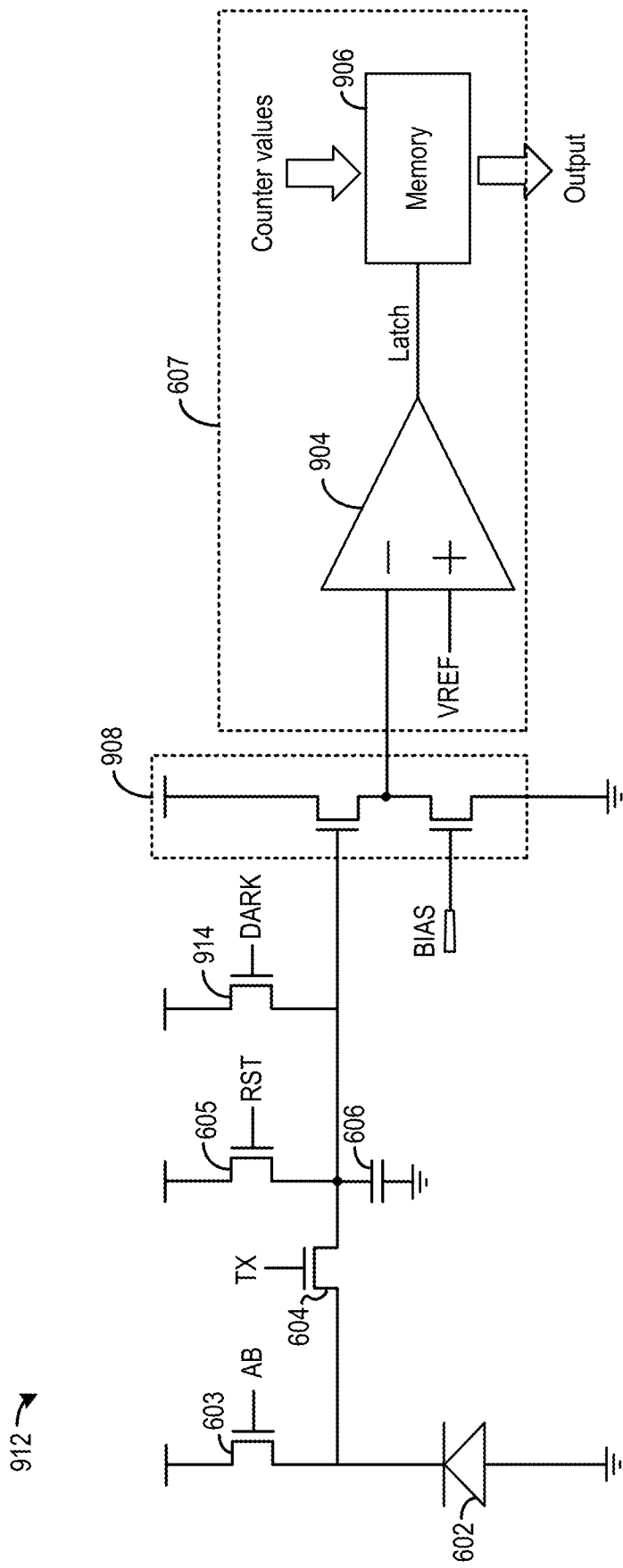

FIG. 9B illustrates an example of pixel cell 912 which can be configured to operate in a dark mode. As shown in FIG. 9B, pixel cell 912 includes a dark gate 914. Either dark gate 914 or reset gate 605 (or both) can reset charge storage device 606. Similar to FIG. 9A, dark gate 914 can receive a control signal (labelled "DARK") from the configuration memory, which receives the control signal from transistor T of the pixel cell based on the row selection and column selection signals on the row bus and column bus, as described in FIG. 8B. The row and column selection signals can be generated based on pixel array programming maps 720a of FIG. 7C. When the DARK signal is asserted, pixel cell 912 can generate a pixel output representing a dark pixel (e.g., a pixel that does not receive incident light). The pixel output can be used to perform calibration (e.g., to account for the effect of temperature). For example, other pixel cells can operate in normal mode (e.g., with the DARK signal turned off), and their pixel output can be offset or scaled based on the dark pixel value to remove the effect of temperature on the pixel output, such that the adjusted pixel output can provide a more accurate representation of the intensity of incident light.

Figure 9C:
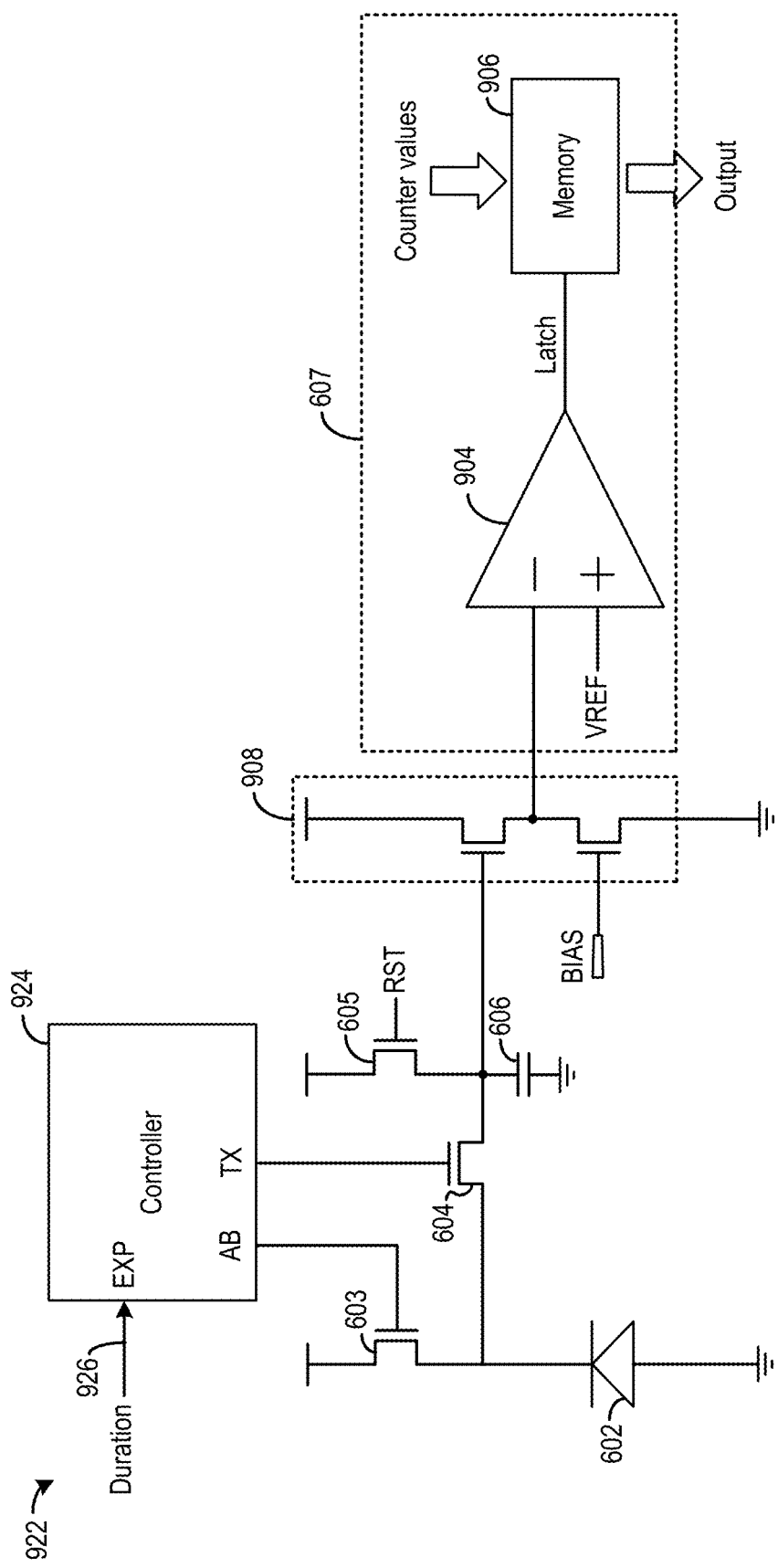

FIG. 9C illustrates an example of pixel cell 922 which has a programmable exposure period. As shown in FIG. 9C, pixel cell 922 includes a controller 924 to control the AB signal to electronic shutter gate 603 and the TX signal to transfer gate 604. Controller 924 can accept an input 926 indicating an exposure period duration and control the time difference between the release of the AB signal and the release of the TX signal, as described in FIG. 6B, to set the exposure period. Pixel array programming maps 720b of FIG. 7C can be used to convey the exposure period duration for each pixel cell, and the duration information can be forwarded to the configuration memory of each pixel cell via the column buses C and/or the row buses R. In some examples, the exposure period of pixel cell 922 can be set at zero to generate dark pixel data for calibration as described in FIG. 9B. In some examples, programmable exposure period can also be implemented based on, for example, selectively turning on groups of pixel cells at the start of their exposure periods and turning off groups of pixels cell at end of their exposure periods.

Figure 9D:
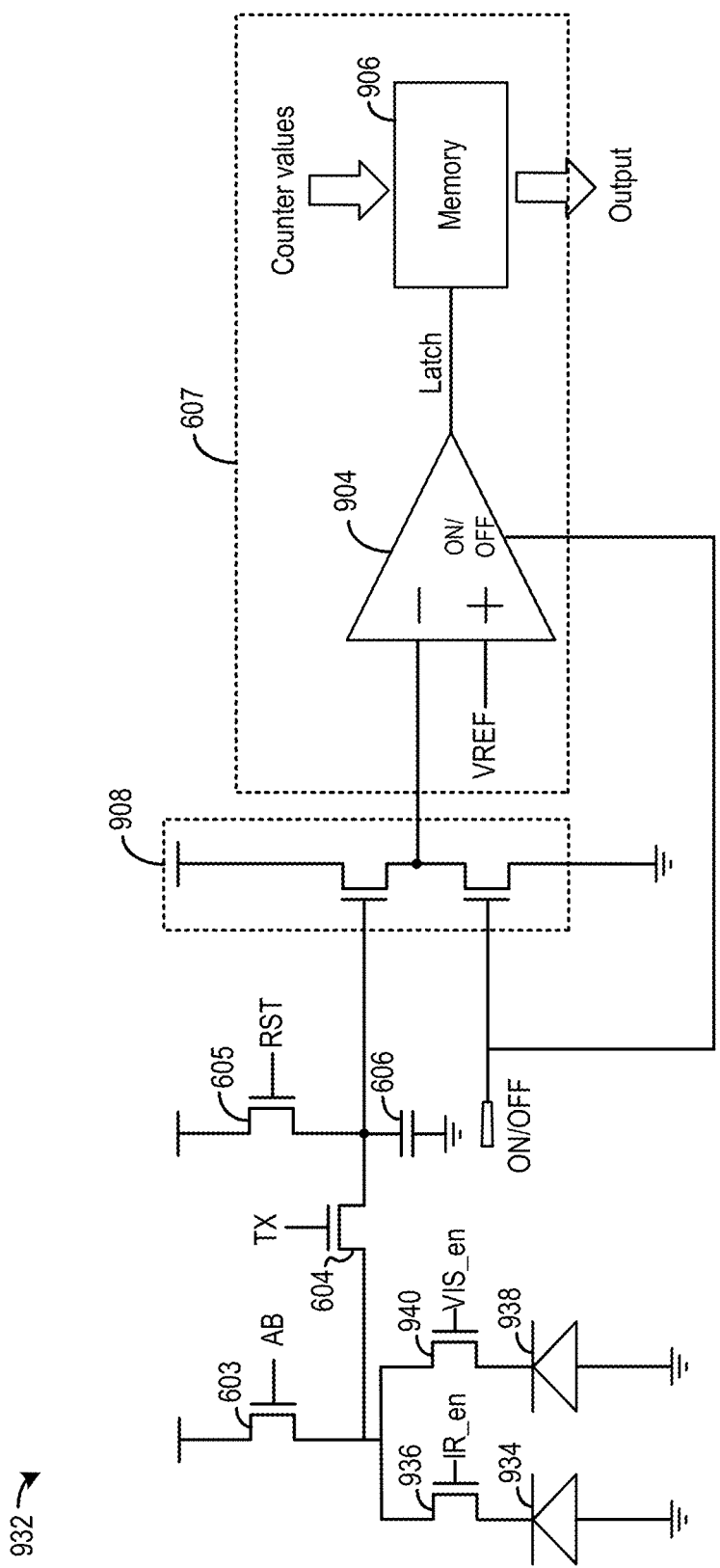

FIG. 9D illustrates an example of pixel cell 932 which can be configured to measure light of different wavelengths, or to generate no pixel data output. As shown in FIG. 9D, pixel cell 932 includes a first photodiode 934, a first photodiode enable gate 936, a second photodiode 938, and a second photodiode enable gate 940. First photodiode 934 can be configured to measure light in the infra-red wavelength range, whereas second photodiode 938 can be configured to measure light in the visible wavelength range. Although not shown in FIG. 9D, it is understood that each photodiode can be coupled with an electronic shutter gate and a transfer gate. Pixel cell 932 can be configured to operate one of three modes. In a first mode, the IR_en signal can be asserted, which allows first photodiode enable gate 936 to transfer charge from first photodiode 934 to charge storage device 606 for measurement. In a second mode, the VIS_en signal can be asserted, which allows second photodiode enable gate 940 to transfer charge from second photodiode 938 to charge storage device 606 for measurement. In both first mode and second mode, comparator 904 and voltage buffer 908 are enabled to perform quantization of the charge. In a third mode, comparator 904 and voltage buffer 908 are disabled, and pixel cell 932 does not output pixel data. The IR_en signal, VIS_en signal, and the On/Off signal can be provided to the configuration memory of each pixel cell via the column buses C and/or the row buses R and based on pixel array programming maps 720b of FIG. 7C. In some examples, an image sensor comprising pixel cell 932 can be configured to generate 2D image frames (based on sensing of visible light) and 3D image frames (based on sensing of infra-red light) at different times to provide fusion of 2D-3D sensing.

Figure 9E:
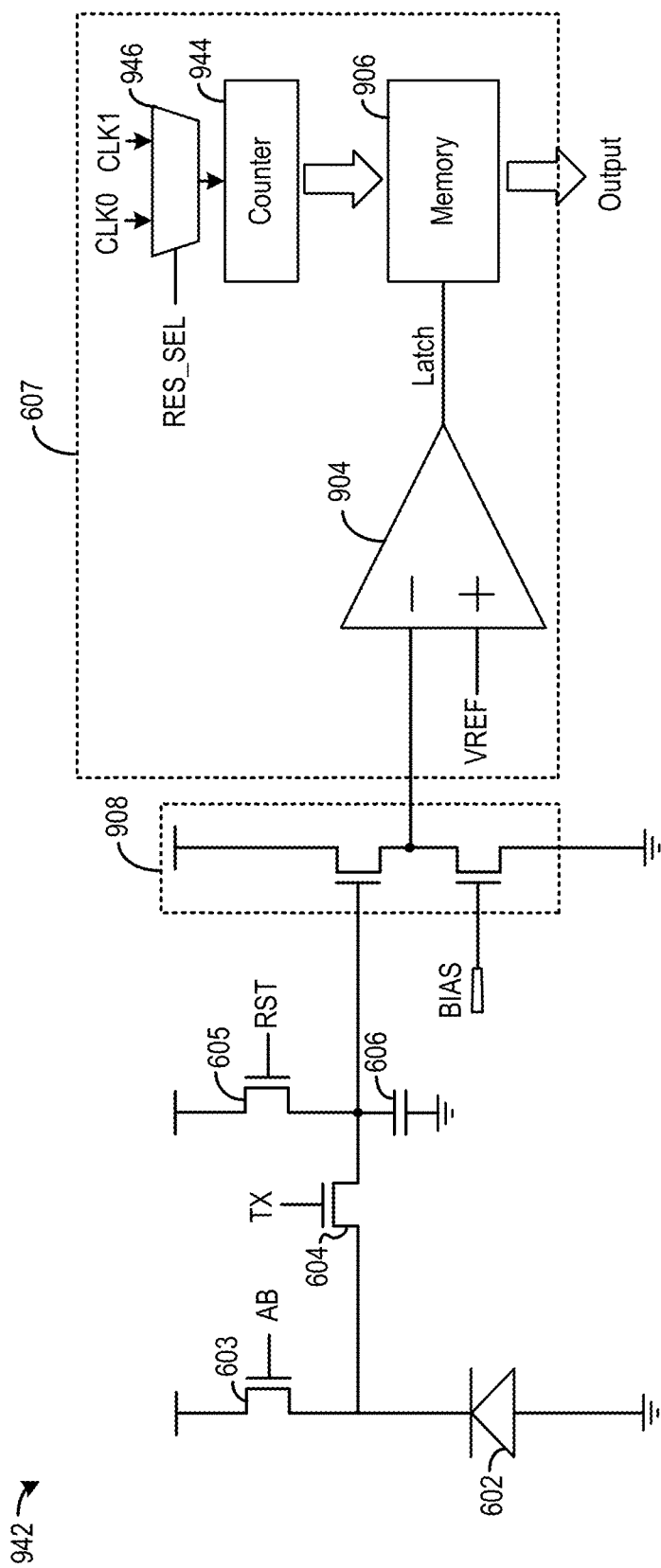

FIG. 9E illustrates an example of pixel cell 942 which can be have a configurable quantization resolution/bit width. The quantization resolution can be programmed based on setting the frequency at which the counter value is updated by the counter, as described in FIG. 6C. As shown in FIG. 9E, quantizer 607 of pixel cell 942 may include a local counter 944 and a clock multiplexor 946 to select between clock signal CLK0, which can be a default clock, and clock signal CLK1, which can run faster or slower than CLK0 to provide higher or lower quantization resolutions. The selection of the clock signal can be based on an RES_SEL signal. In some examples, the CLK0 and CLK1 clock signals, as well as the RES_SEL signal, can be supplied to the pixel cells via the column buses C and/or row buses R and based on pixel array programming maps 720b of FIG. 7C. Meanwhile, pixel data output module 807 can also be configured to skip the read out of certain bits (e.g., most significant bits) of the pixel data output from pixel cells having a lower quantization resolution and lower bit width based on control signals from programming map parser 802. In some examples, the programming of the quantization resolution/bit depth can be performed to maximize the efficiency of sensing and transmission of pixel data. For example, pixel cells that are determined as not providing relevant information for an application can be disabled from generating pixel data, or can be configured to generate pixel data at a lower quantization resolution, whereas pixel cells that are determined as providing relevant information can be configured to generate pixel data at a higher quantization resolution.

Besides changing clock frequencies, other techniques are available to change the quantization resolution. For example, the bias current of comparator 904 can be adjusted to set its gain which can also set the quantization resolution. As another example, a subset of bits of memory 906 can be power-gated to be enabled or disabled to change the bit depth. The bias current and the bit depth for each pixel can be indicated in pixel array programming map 720.

Figure 9F:
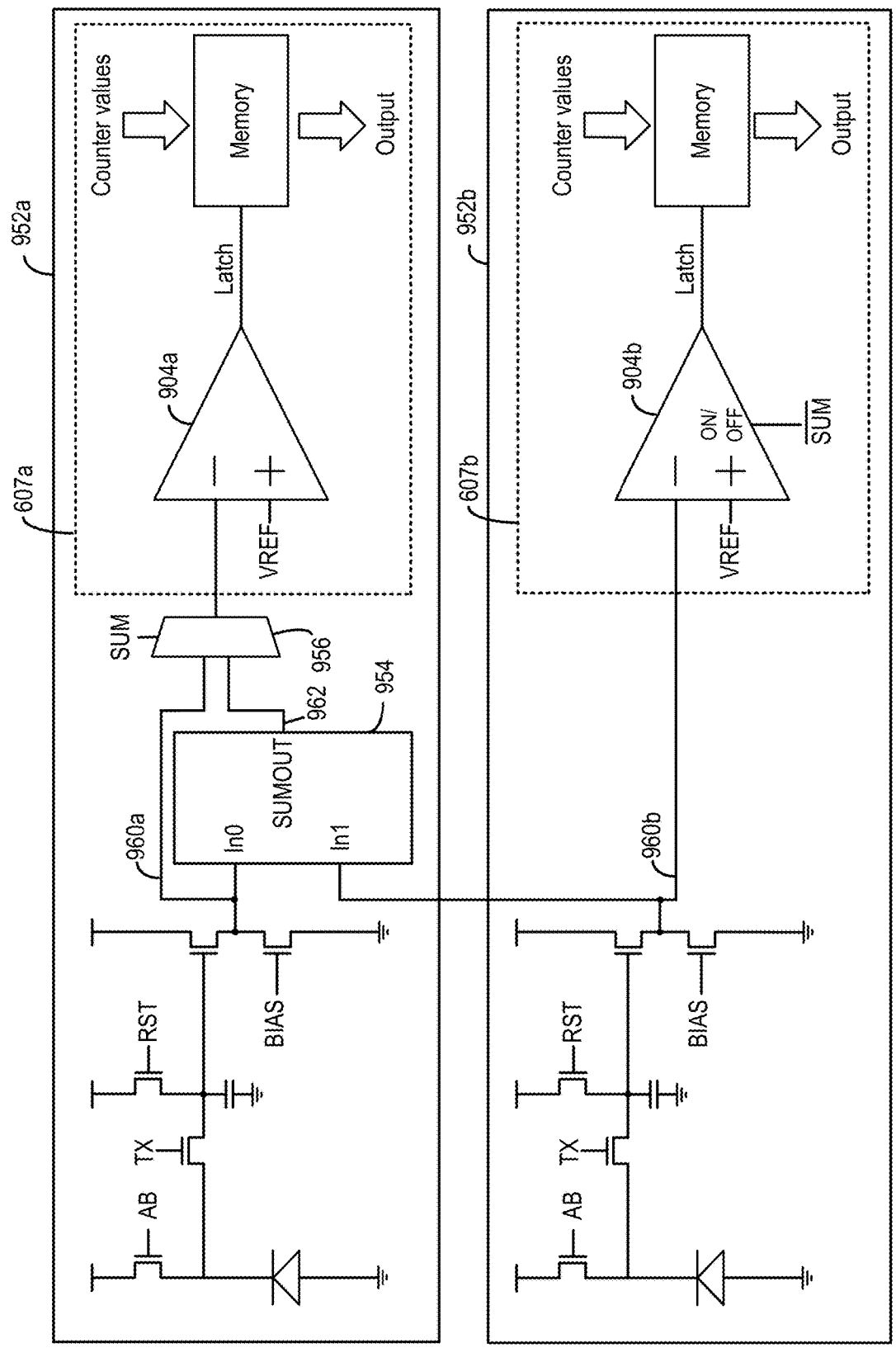

FIG. 9F illustrates two pixel cells 952a and 952b which can be configured to perform a pixel binning operation as a group, which can reduce the pixel data sent to the host device. Pixel cell 952a can be designated as a master pixel cell within the group and can include a voltage summation circuit 954 and a voltage multiplexor 956. When operating under the pixel binning scheme, the buffered analog voltages 960a and 960b of pixel cells 952a and 952b can be summed by voltage summation circuit 954 to generate a summed voltage 962. Voltage multiplexor 956 can be controlled by a SUM signal to forward summed voltage 962 from voltage summation circuit 954 to comparator 904a of quantizer 607a to perform quantization to generate pixel data representing the group. Moreover, comparator 904b of quantizer 607b of pixel cell 952b can be disabled by an inverted SUM signal (SUM) to disable the generation of pixel data at pixel cell 952b. When the pixel binning scheme is disabled, voltage multiplexor 956 can be controlled by the SUM signal to forward buffered analog voltage 960a to comparator 904a for quantization to output pixel data, whereas comparator 904a of quantizer 607a of pixel cell 952b can also be enabled to quantize buffered analog voltage 960b to output pixel data. In some examples, the aforementioned pixel binning scheme can be activated by setting the programming data corresponding to master pixel cells to 1 in pixel array programming map 720a. Column controller 804 and row controller 806 can identify the master pixel cells based on control signals 808 and 810 from programming map parser 802, and transmit the SUM signal to the master pixel cells and to other pixel cells within the groups to perform the pixel binning operation. In some examples, the groups of pixels which perform the pixel binning operation can be selected based on a random function. The programming data corresponding to master pixel cells of the selected groups can be set to 1 in pixel array programming map 720a, whereas the programming data corresponding to master pixel cells of other groups can be set to 0.

Besides pixel binning, other techniques can be employed to compress the pixel data. One example is compressive sensing. In compressive sensing, pixel values across selected rows/columns can be summed. Different frames can have different rows/columns summed, which allow the pixel data of each frame to be compressed into one or more vectors having fewer elements than the number of pixels in a frame. To perform compressive sensing, each row or each column of pixel cell array 718 can include an adder. Based on pixel array programming map 720a, one or more rows/columns of pixel cells can be controlled to output the pixel data to the adder for summation, and the summed pixel data can then be forwarded to pixel data output module 807 in lieu of the pixel data of individual pixel cells of the selected row/column.

Figure 10A:
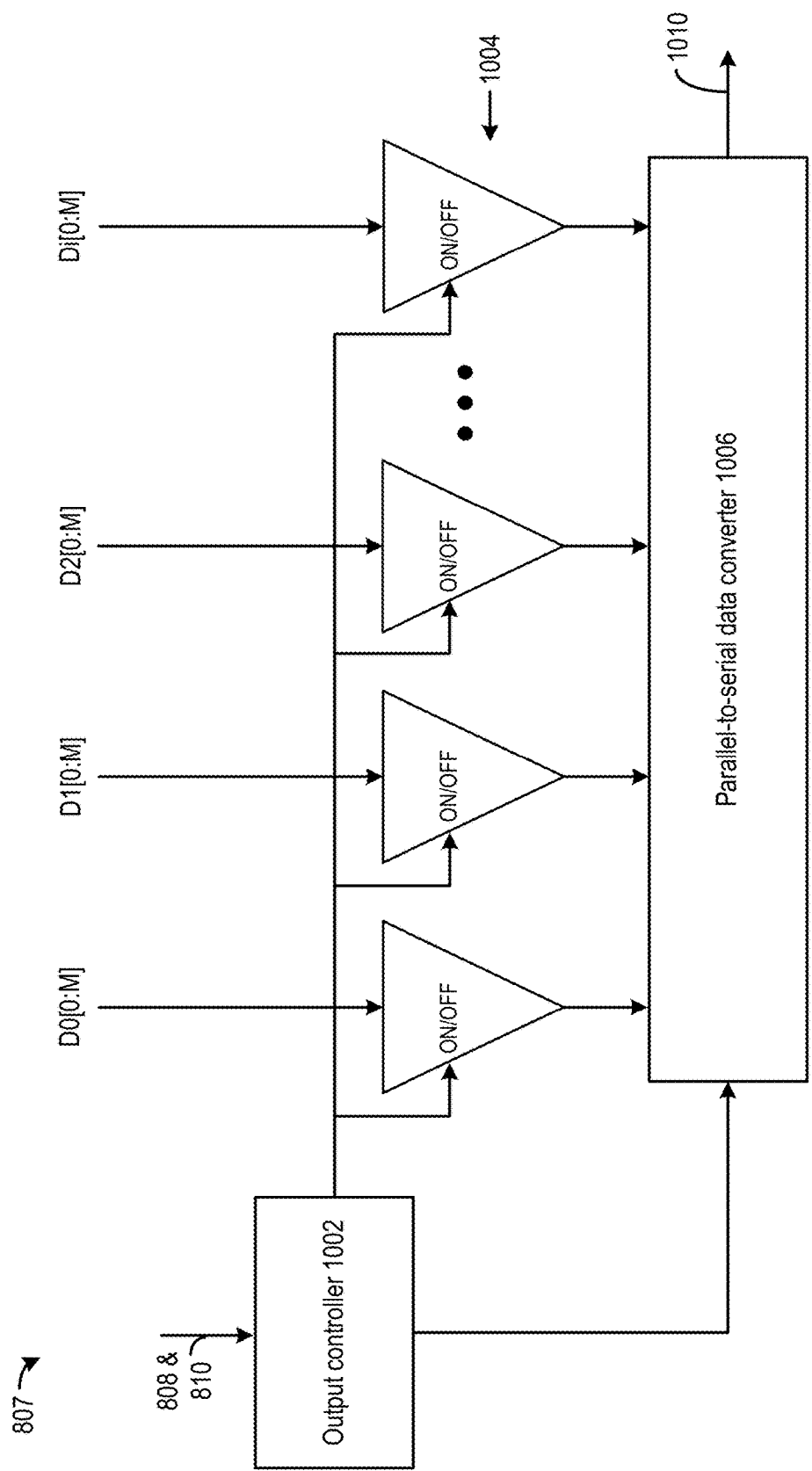
FIG. 10A and FIG. 10B illustrate example components of the image processing system of FIGS. 7A-7C.
Figure 10B:
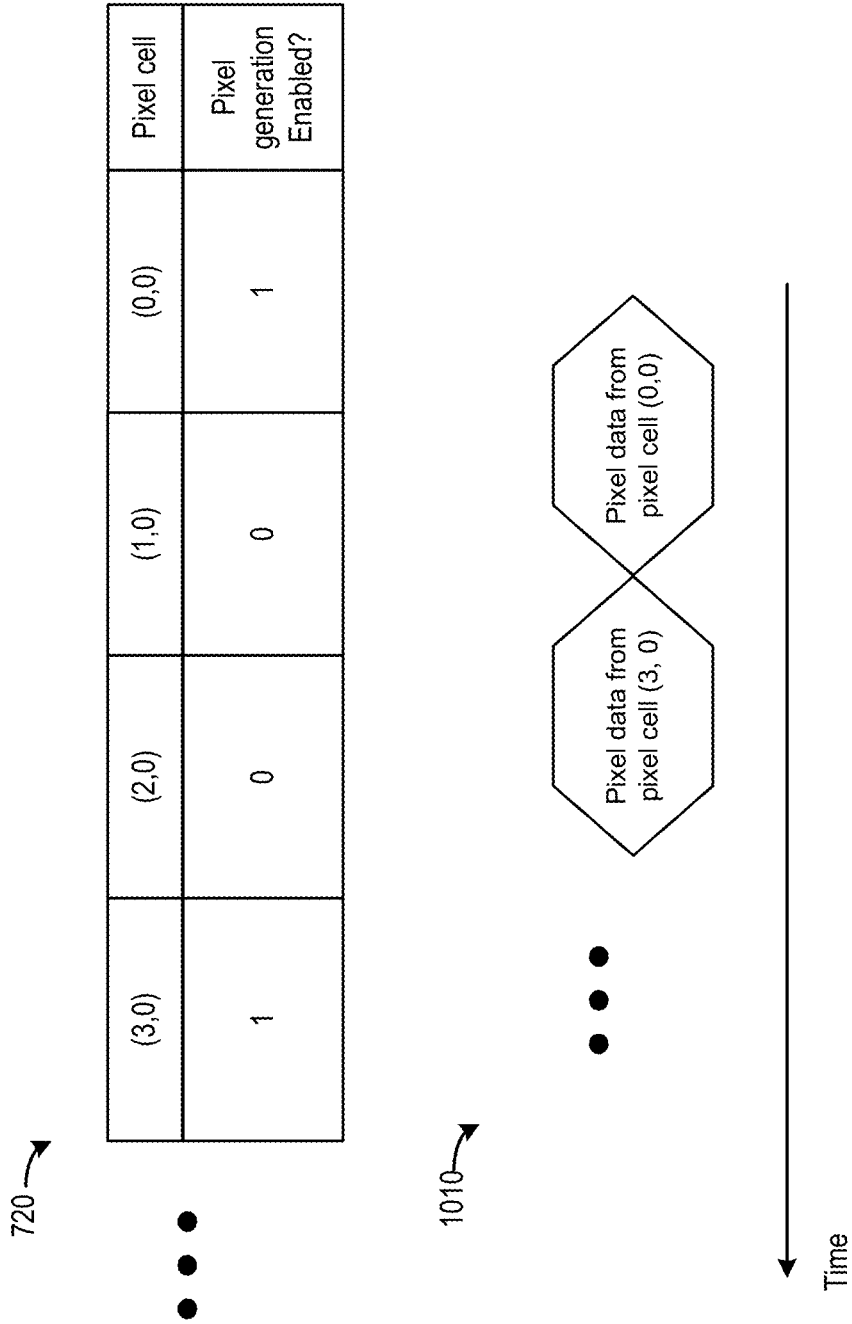

FIG. 10A illustrates example components of pixel data output module 807, whereas FIG. 10B illustrates an example operation of pixel data output module 807. As shown in FIG. 10A, pixel data output module 807 can include an output controller 1002, an array of sense amplifiers 1004, and a parallel-to-serial data converter 1006. Array of sense amplifiers 1004 can amplify the signal level of digital pixel data outputs received from output buses D0, D1, . . . Di, each corresponding to a column of pixel cells, and transmit the amplified signals to parallel-to-serial data converter 1006. Parallel-to-serial data converter 1006 can include a shift register (not shown in FIG. 10A) to receive the amplified signals as parallel data and shift the parallel data out in the form of a serial data stream 1010. Pixel data output module 807 further includes a transmitter circuit (not shown in FIG. 10A) to transmit the serial data stream 1010 according to a pre-determined protocol, such as MIPI.

Output controller 1002 can control the operations of array of sense amplifiers 1004 and parallel-to-serial data converter 1006 based on control signals 808 and 810 from programming map parser 802. Control signals 808 and 810 may indicate, for example, the pixel data generation at certain pixel cells is disabled, the pixel data of certain pixel cells have a different bit width from other pixel cells, etc. For example, referring to FIG. 10B, output controller 1002 can identify, based on control signals 808 and 810 (which are derived from pixel array programming map 720), that pixel output generation is disabled at pixel cells (1, 0) and (2, 0). Based on this information, when performing a read out of output buses for a row of pixel cells (0, 0) to (3, 0), output controller 1002 can control parallel-to-serial data converter 1006 not to include the outputs from pixel cells (1, 0) and (2, 0) in serial data stream 1010, such that data stream 1010 can include the pixel data from pixel cell (3, 0) followed immediately by the pixel data from pixel cell (0, 0). As another example (not shown in FIG. 10B), pixel array programming map 720 may indicate that the pixel data output by pixel cell (0, 0) has a full bit depth, whereas the pixel data output by pixel cell (3, 0) has a half bit depth. Based on this information (reflected in control signals 808 and 810), output controller 1002 can control parallel-to-serial data converter 1006 to include the full outputs from pixel cell (0, 0) in serial data stream 1010, but skip half of outputs (e.g., the most significant bits) from pixel cell (3, 0) in data stream 1010. In addition, in a case where an entire row of pixel cells is disabled from generating pixel data, output controller 1002 can also power off the entire array of sense amplifiers 1004 and not transmit the outputs from that row of pixel cells to parallel-to-serial data converter 1006.

Host device 702 can also synchronize the reception and extraction of pixel data from data stream 1010 based on pixel array programming map 720. For example, based on pixel array programming map 720, host device 702 can determine that a first set of bits of data stream 1010 is the pixel data of pixel cell (0, 0), a second set of bits immediately following the first set of bits of data stream 1010 is the pixel data of pixel cell (3, 0), etc.

Figure 11A:
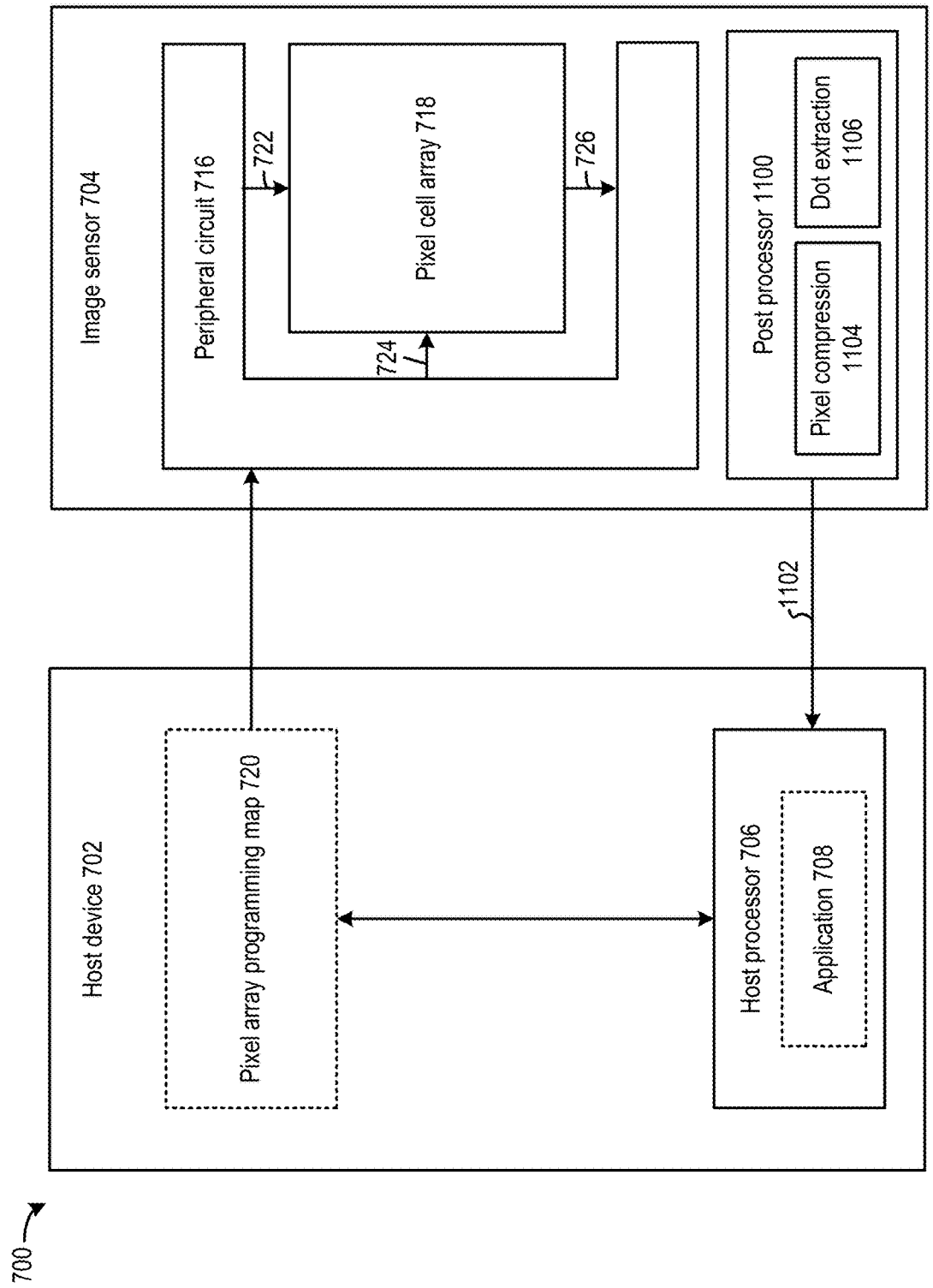
FIG. 11A and FIG. 11B illustrate another example of an image processing system and its operations.

Referring to FIG. 11A, in some examples, image sensor 704 can include a post processor 1100 to perform post processing of the pixel data output by pixel cell array 718, and transmit post-processed data 1102 to host device 702. The post processing can be performed to further reduce the volume of data transmitted to host device 702. In some examples, post processor 1100 can be on the same chip (e.g., same semiconductor substrate) as at least some components of image sensor 704. For example, image sensor 704 may include a stack of a first semiconductor substrate and a second semiconductor substrate, with the first semiconductor substrate having pixel cell array 718 and the second semiconductor substrate having peripheral circuit 716 and post-processor 1100.

Post processor 1100 may include a pixel compression module 1104, a dot extraction module 1106, etc., to perform data compression operations. In some examples, pixel compression module 1104 may perform, for example, a compressive sensing operation based on summing the pixel data outputs of pixel cells of selected groups, and transmitting the summed pixel data outputs to host device 702 to represent the outputs of the selected groups. In some examples, pixel compression module 1104 can perform a temporal compression operation, in which pixel compression module 1104 can process frames of pixel data from pixel cell array 718 at a first frame rate, compress the pixel data, and output compressed pixel data to host device 702 at a second frame rate lower than the first frame rate. The compression can be based on, for example, a Moving Picture Experts Group (MPEG) standard. In some examples, pixel compression module 1104 can also extract image features from the pixel data (e.g., based on a neural network processing), and transmit only pixel data containing the image features to host device 702.

Post processor 1100 can also perform other different types of post-processing, such as HDR multiple exposure capture, optical flow, etc. HDR would combine multiple frames with different exposure times. Such operation allows discarding data where pixels saturate, or the signal is buried below the noise floor. Such operation also allows averaging photon flux across multiple measurements. In optical flow, temporal difference between two frames to compute temporal derivatives and spatial derivative using, for example, Lucas-Kanade method. The derivatives can be used for various applications, such as extraction of image features, computer vision, etc.

Figure 11B:
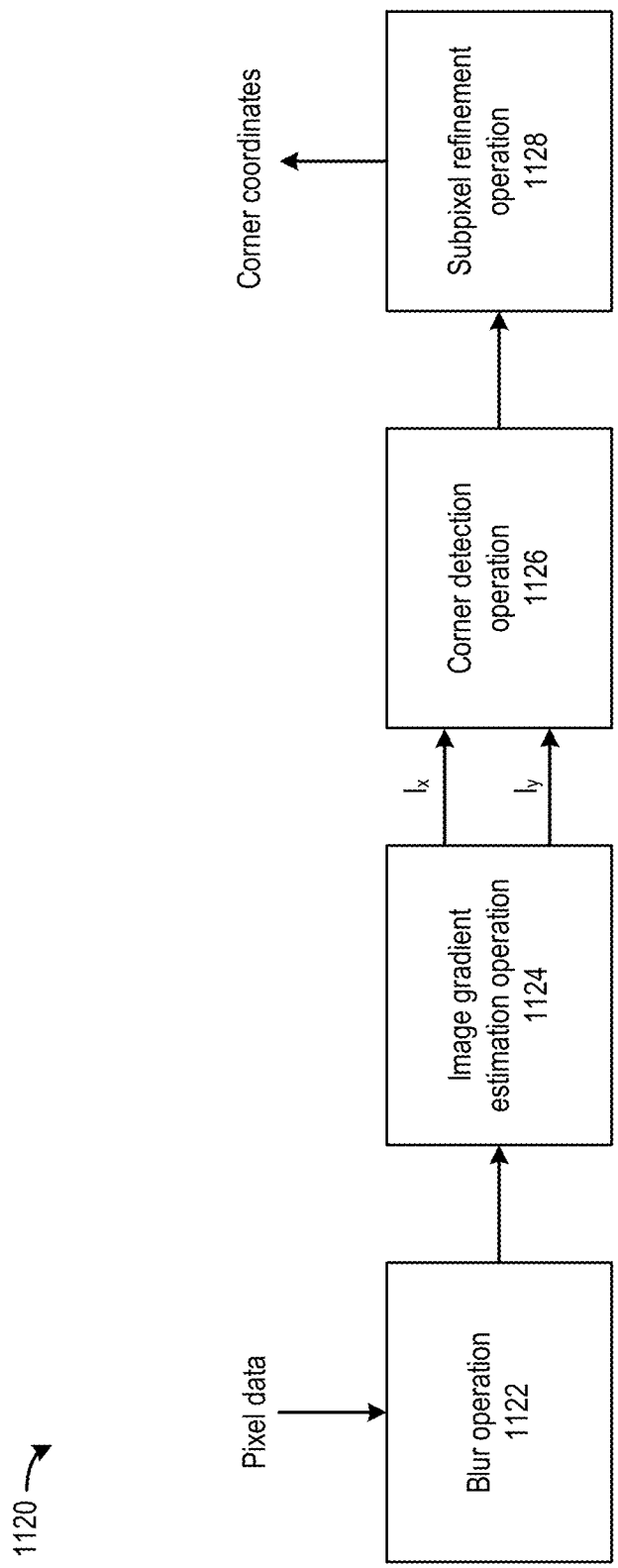

In addition, dot extraction module 1106 can determine image locations (at pixel or sub-pixel resolution) of patterns (e.g., dots) of reflected structured light, which can be used for 3D sensing. FIG. 11B illustrates an example flow of a dot extraction operation 1120. Referring to FIG. 11B, dot extraction operation 1120 may include a blur operation 1122, an image gradient estimation operation 1124, a corner detection operation 1126, and a sub-pixel refinement operation 1128. Blur operation 1122 may include performing convolution operations between groups of pixel data of an input image and a blur kernel to reduce spatial and temporal noise. The results of the convolution operations can be stored in a blur buffer as an array of noise-processed pixel data having the same dimension as the input image.

Image gradient estimation operation 1124 can include performing convolution operations between groups of noise-processed pixel data with a Sobel kernel to compute estimates of partial derivatives with respect to the horizontal dimension (represented by $I_x$ in FIG. 11A) and partial derivatives with respect to the vertical dimension (represented by $I_y$ in FIG. 11B) for each pixel of the input image.

Corner detection operation 1126 can be performed on an array of partial derivatives $I_x$ and $I_y$. In some examples, corner detection operation 1126 can compute a matrix M based on partial derivatives $I_x$ and $I_y$ within a window W of the array of partial derivatives $I_x$ and $I_y$ based on the following equation:

$$M = \sum_{(x,y)\in W} \begin{bmatrix} I_x^2 & I_x I_y \\ I_x I_y & I_y^2 \end{bmatrix} = \begin{bmatrix} \sum_{(x,y)\in W} I_x^2 & \sum_{(x,y)\in W} I_x I_y \\ \sum_{(x,y)\in W} I_x I_y & \sum_{(x,y)\in W} I_y^2 \end{bmatrix} \quad \text{(Equation 1)}$$

In Equation 1, the element $m_{11}$ of matrix M is computed by a summation of products of square of h for each pixel within window W. The element $m_{22}$ of matrix M is computed by a summation of products of square of $I_y$ for each pixel within window W. Moreover, each of the elements $m_{12}$ and $m_{21}$ is computed by a summation of products of $I_x$ and $I_y$ for each pixel within window W. Multiple matrices M can be computed for different windows W of the array of partial derivatives $I_x$ and $I_y$.

For each matrix M (and window W), a Harris corner response R can be computed based on the following equation:

$$R = \det(M) - k(\text{trace}(M))^2 \quad \text{(Equation 2)}$$

In Equation 2, det(M) refers to the determinant of matrix M, trace(M) refers to the sum of diagonal elements $m_{11}$ and $m_{22}$ of matrix M, whereas k can be an empirically determined constant and can be within a range between 0.04 and 0.06. A window having a Harris corner response R greater than a threshold can indicate that the window contains sufficiently large image gradients, and such a window is likely to include a pattern (e.g., a dot) of reflected structured light. The pixel location of the window can represent a coarse estimate of pixel location of a dot, and multiple pixel locations of dots can be calculated from corner detection operation 1126.

Subpixel refinement operation 1128 can then be performed on the pixel locations of the dots. In some example, a Gauss-Newton optimization operation can be performed to fit a Gaussian curve onto the image data within a single kernel (e.g., a 3×3 kernel, a 4×4 kernel, or groups of pixels) to determine the centroid of the dots at a subpixel precision.

Figure 12:
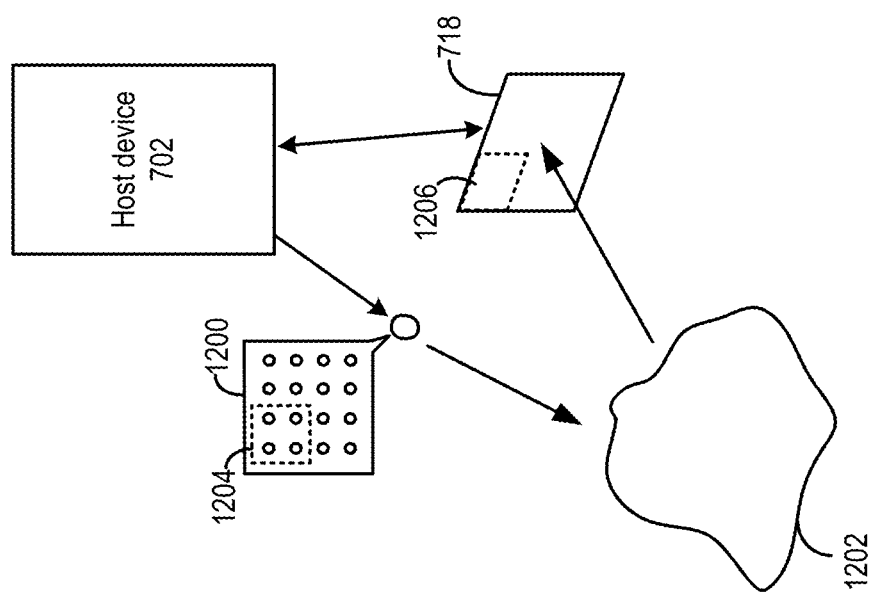
FIG. 12 illustrate an example operation of the example image processing systems of FIGS. 7A-7C and FIGS. 11A and 11B.

In some examples, host device 702 can also coordinate the light projection operations between an illuminator and the light measurement operations at pixel cell array 718 using pixel array programming map 720. FIG. 12 illustrates an example of such an application. As shown in FIG. 12, an illuminator 1200 can be controlled by host device 702 to project structured light towards an object 1202, whereas pixel cell array 718 can detect light reflected by object 1202 to perform 3D sensing. Illuminator 1200 may be controlled by illuminator 1200 to only illuminate only a part of object 1202 based on a scanning pattern. For example, illuminator 1200 may include an array of light emitters (e.g., light emitting diodes) and only a portion of the light emitters, such as portion 1204, is activated by host device 702 at a time to illuminate a part of object 1202. As another example, illuminator 1200 may include a single illuminator and a mirror. Host device 702 can control the mirror to reflect the light generated by the single illuminator towards a part of object 1202.

Host device 702 can synchronize the illumination of object 1202 with the light measurement operations at pixel cell array 718 by, for example, enabling a subset of pixel cells of pixel cell array 718, such as subset 1206, at a time to detect light reflected by object 1202. The subsets are determined based on the illumination sequence such that at any given time during the illumination sequence, the selected subset of pixel cells is the most likely to receive light reflected by object 1202. To perform the synchronization, host device 702 can generate pixel array programming map 720 based on the sequence of illumination by illuminator 1200 as reflected by the sequence of activation of the light emitters of illuminator 1200, the sequence of movement of the mirror of illuminator 1200, etc.

The techniques described in FIG. 12 can be used to reduce power by only illuminating regions with relevant information. For example, host device 702 can control illuminator 1200 to project light over a relatively small area of object 1202 which contains the relevant information, while assigning a larger number of pixel cells of pixel cell array 718 to detect the light reflected from object 1202 from that small area. Such arrangements also allows high resolution 3D sensing without necessarily increasing the overall dimension of pixel cell array 718. Moreover, as only a subset of pixel cells of pixel cell array 718 transmit pixel data, the bandwidth and power for transmission and processing of the pixel data can be reduced as well.

Figure 13:
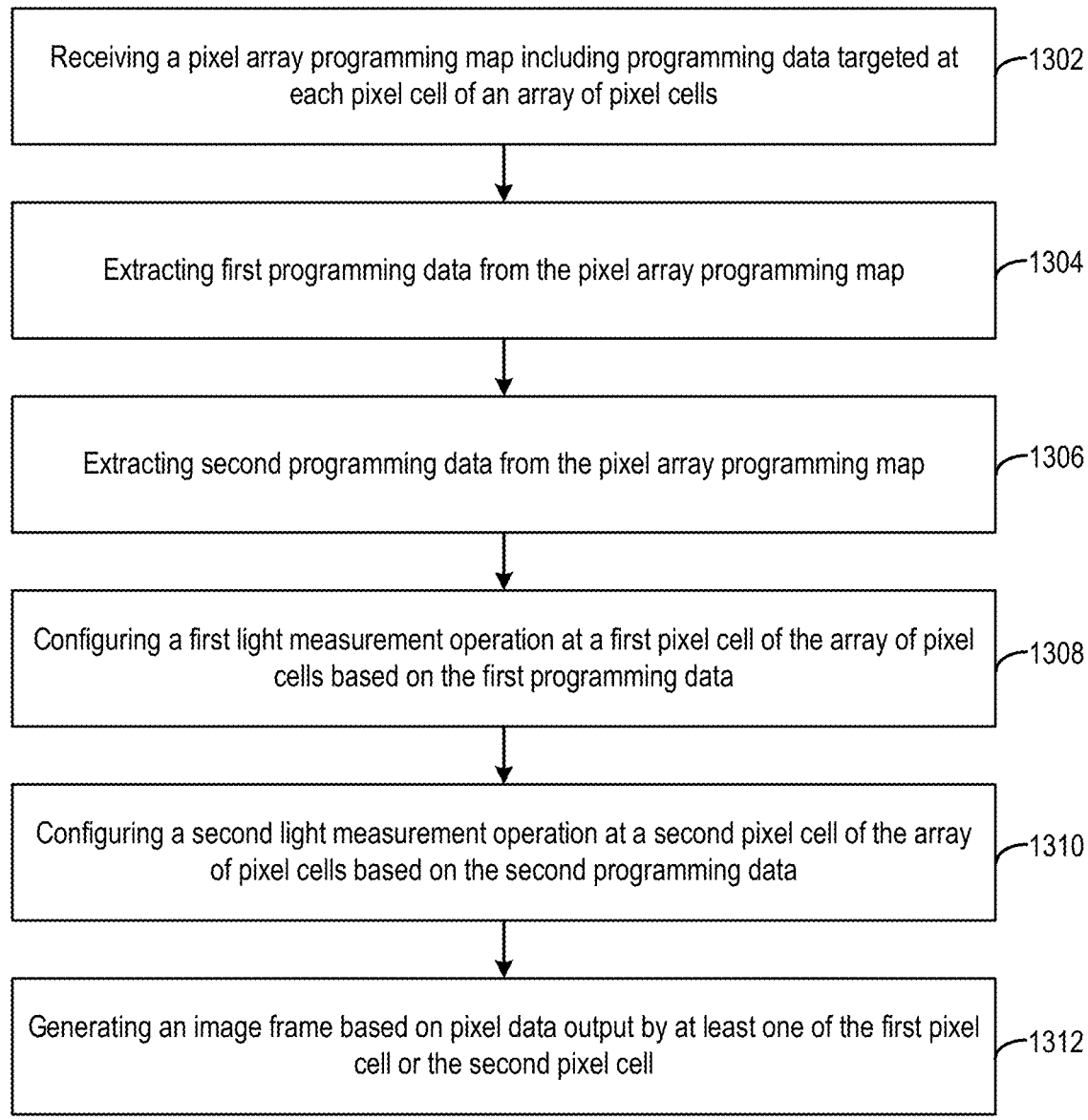
FIG. 13 illustrates a flowchart of an example process for generating image data.

FIG. 13 is a flowchart of an example method 1300 for generating image data. Method 1300 can be performed by, for example, an image processing system such as image processing system 700. The image processing system may include an array of pixel cells, such as pixel cell array 718, where each pixel cell of the array of pixel cells configured to perform a light measurement operation and to generate a digital output of the light measurement operation. Each pixel cell is also associated with a configuration memory (e.g., configuration memory 830) that is individually addressable. The image process system further includes a peripheral circuit (e.g. peripheral circuit 716) that can configure the light measurement operations at the array of pixel cells, and an image processor (e.g., host processor 706) configured to generate an image frame based on the digital outputs of at least some of the array of pixel cells.

Method 1300 starts with step 1302, in which peripheral circuit 716 receives a pixel array programming map including programming data targeted at each pixel cell of an array of pixel cells. The pixel array programming map may include, for example, pixel array programming map 720. In some examples, the programming data of each entry of pixel array programming map 720 can be transmitted sequentially following a pre-determined scanning pattern, such as traversing a row from left to right, followed by the next row from left to right, to form a stream of serial data.

In step 1304, peripheral circuit 716 can extract first programming data for a first pixel cell of the array of pixel cells from the pixel array programming map. In step 1306, peripheral circuit 716 can extract second programming data for a second pixel cell of the array of pixel cells from the pixel array programming map. As described above, the programming data for each entry can be extracted and identified from the stream of serial data based on the scanning pattern and the order by which the entries are received. Based on a mapping between the pixel cells and the entries, peripheral circuit 716 can identify and extract the first and second programming data from the pixel array programming map.

In step 1306, peripheral circuit 716 can configure a first light measurement operation at the first pixel cell based on the first programming data. The configuration can be based on transmitting one or more row signals and one or more column signals along respectively the row buses and column buses to select the configuration memory of the first pixel cell to receive the first programming data. The configuration can include, for example, enabling/disabling generation of pixel data at the first pixel cell, configuring the first pixel to operate in a dark mode (to generate dark pixel data) or in a normal mode, setting a wavelength range of measurement, the duration of exposure period, a quantization resolution, pixel binning operation, compressive sensing, etc.

In step 1308, peripheral circuit 716 can configure a second light measurement operation at the second pixel cell based on the second programming data. The configuration can be based on transmitting one or more row signals and one or more column signals along respectively the row buses and column buses to select the configuration memory of the second pixel cell to receive the second programming data. The configuration can include, for example, enabling/disabling generation of pixel data at the first pixel cell, configuring the first pixel to operate in a dark mode (to generate dark pixel data) or in a normal mode, setting a wavelength range of measurement, the duration of exposure period, a quantization resolution, pixel binning operation, compressive sensing, etc. The first programming data and the second programming data can be different.

In step 1310, the image processor can generate an image frame based on pixel data output by at least one of the first pixel cell or the second pixel cell. For example, the pixel cells can output pixel data to pixel data output module, which can stream the pixel data to the image sensor. The image sensor can operate an application to generate an image frame based on the pixel data.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
an array of pixel cells, each pixel cell of the array of pixel cells configured to perform a light measurement operation and to generate a digital output of the light measurement operation;
a peripheral circuit configured to:
receive a pixel array programming map including programming data targeted at each pixel cell of the array of pixel cells; and
configure the light measurement operation at the each pixel cell based on the programming data targeted at the each pixel cell; and
an image processor configured to generate an image frame based on the digital outputs of at least some of the array of pixel cells,
wherein the peripheral circuit is further configured to disable generation of digital pixel data from one or more pixel cells of the array of pixel cells based on the pixel array programming map.

2. The apparatus of claim 1, wherein the each pixel cell of the array of pixel cells is associated with a configuration memory that is individually addressable;
wherein the peripheral circuit is configured to:
extract first programming data for a first pixel cell of the array of pixel cells from the pixel array programming map;
extract second programming data for a second pixel cell of the array of pixel cells from the pixel array programming map;
generate a first address based on the first programming data;
generate a second address based on the second programming data;
select, based on the first address, the configuration memory of the first pixel cell to receive the first programming data; and
select, based on the second address, the configuration memory of the second pixel cell to receive the second programming data; and
wherein the first programming data and the second programming data are different.

3. The apparatus of claim 2, wherein the pixel array programming map comprises an array of programming data; and
wherein the first address is generated based on a location of the first programming data within the array of programming data.

4. The apparatus of claim 2, wherein the each pixel cell includes at least one device to control the generation of the digital output; and
wherein the peripheral circuit is configured to:
transmit, based on the first address, a first signal to the at least one device of the first pixel cell to enable the generation of a first digital output at the first pixel cell; and
transmit, based on the second address, a second signal to the at least one device of the second pixel cell to disable the generation of a second digital output at the second pixel cell.

5. The apparatus of claim 4, wherein the peripheral circuit is configured to disable one or more sense amplifiers configured to amplify the second digital output based on the second address.

6. The apparatus of claim 4, wherein the peripheral circuit is configured to output a stream of digital outputs including the first digital output to the image processor; and
wherein the image processor is configured to:
synchronize timing of reception of the stream of digital outputs based on the pixel array programming map; and
identify the first digital output from the stream of digital outputs based on the synchronization.

7. The apparatus of claim 4, wherein the first programming data and the second programming data are generated based on a region of interest determined from a prior image frame.

8. The apparatus of claim 2, wherein the each pixel cell is configured to perform the light measurement operation within a programmable exposure period;
wherein the peripheral circuit is configured to:
transmit, based on the first address, a first signal to the first pixel cell to set a first exposure period for a first light measurement operation; and
transmit, based on the second address, a second signal to the second pixel cell to set a second exposure period for a second light measurement operation, the second exposure period being different from the first exposure period; and
wherein the image processor is configured to receive a first digital output of the first light measurement operation and a second digital output of the second light measurement operation.

9. The apparatus of claim 8, wherein the peripheral circuit is configured to transmit, based on the first address, the first signal to the first pixel cell to perform the first light measurement operation based on at least one of: setting the first exposure period to zero or putting the first pixel cell in a reset state;
wherein the image processor is configured to:
perform a calibration operation based on the first digital output; and
determine an intensity of light received by the second pixel cell based on the second digital output and a result of the calibration operation.

10. The apparatus of claim 2, wherein the each pixel cell is configured to generate an analog signal representing a result of the light measurement operation, the digital output being generated based on quantizing the analog signal at a programmable quantization resolution; and
wherein the peripheral circuit is configured to:
transmit, based on the first address, a first signal to the first pixel cell to set a first quantization resolution; and
transmit, based on the second address, a second signal to the second pixel cell to set a second quantization resolution different from the first quantization resolution.

11. The apparatus of claim 10, wherein the each pixel cell includes a counter configured to generate the digital output based on comparing the analog signal with a ramping signal, the quantization resolution being programmable based on a frequency of a clock signal supplied to the counter; and
  wherein the peripheral circuit is configured to:
    transmit, based on the first address, a first clock signal of a first clock frequency to the first pixel cell to set the first quantization resolution; and
    transmit, based on the second address, a second clock signal of a second clock frequency to the second pixel cell to set the second quantization resolution.

12. The apparatus of claim 2, wherein the first pixel cell includes a summation circuit configured to generate a summation signal based on summing a first analog signal from a first light measurement operation at the first pixel cell and a second analog signal from a second light measurement operation at the second pixel cell;
  wherein the peripheral circuit is configured to:
    transmit, based on the first address, a first signal to configure the first pixel cell to generate a first digital output based on quantizing the summation signal; and
    transmit, based on the second address, a second signal to the second pixel cell to disable generation of a second digital output by the second pixel cell.

13. The apparatus of claim 2, wherein the each pixel includes a first photodiode configured to measure light of a first wavelength range and a second photodiode to measure light of a second wave length range; and
  wherein the peripheral circuit is configured to:
    transmit, based on the first address, a first signal to the first pixel cell to generate a first digital output based on output from the first photodiode; and
    transmit, based on the second address, a second signal to the second pixel cell to generate a second digital output based on an output from the second photodiode.

14. The apparatus of claim 1, further comprising a post processor circuit configured to perform post processing of at least some of the digital outputs of the array of pixel cells,
  wherein the image processor is configured to generate the image frame based on the post processed at least some of the digital outputs of the array of pixel cells; and
  wherein the post processor circuit, the peripheral circuit, and the array of pixel cells are integrated on a semiconductor substrate.

15. The apparatus of claim 14, wherein the array of pixel cells is formed on a first semiconductor substrate;
  wherein the peripheral circuit and the post processor circuit are formed on a second semiconductor substrate; and
  wherein the first semiconductor substrate and the second semiconductor substrate forms a stack.

16. The apparatus of claim 14, wherein the post processor circuit is configured to:
  extract, from the at least some of the digital outputs of the array of pixel cells, features corresponding to reflection of structured light by an object;
  based on a result of the extraction, identify pixel cells of which the digital outputs represent the extracted features; and
  transmit only the digital outputs of the identified pixel cells to the image processor.

17. The apparatus of claim 16, wherein the post processor circuit is configured to:
  determine sub pixel locations of the extracted features; and
  provide the sub pixel locations to an application to perform a depth sensing operation of the object.

18. The apparatus of claim 15, wherein the post processor circuit comprises the image processor and is configured to:
  receive the digital outputs generated by the array of pixel cells at a first frame rate; and
  generate image frames based on the digital outputs at a second frame rate lower than the first frame rate.

19. The apparatus of claim 1, further comprising an illuminator configured to project light to different parts of a scene based on an illumination sequence; and
  wherein the pixel array programming map is generated based on the illumination sequence.

20. A method comprising:
  receiving a pixel array programming map including programming data targeted at each pixel cell of an array of pixel cells;
  extracting first programming data for a first pixel cell of the array of pixel cells from the pixel array programming map;
  extracting second programming data for a second pixel cell of the array of pixel cells from the pixel array programming map;
  configuring a first light measurement operation at the first pixel cell based on the first programming data;
  configuring a second light measurement operation at the second pixel cell based on the second programming data; and
  generating an image frame based on digital pixel data output by at least one of the first pixel cell or the second pixel cell, wherein at least one of the first or second light measurement operations comprises disabling generation of digital pixel data from the respective first or second pixel cell.

* * * * *